US010923450B2

(12) United States Patent
Fastow et al.

(10) Patent No.: US 10,923,450 B2
(45) Date of Patent: Feb. 16, 2021

(54) MEMORY ARRAYS WITH BONDED AND SHARED LOGIC CIRCUITRY

(71) Applicant: Intel Corporation, Santa Clara, CA (US)

(72) Inventors: Richard Fastow, Cupertino, CA (US);
Khaled Hasnat, San Jose, CA (US);
Prashant Majhi, San Jose, CA (US);
Owen W. Jungroth, Sonora, CA (US);
Krishna Parat, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/437,445

(22) Filed: Jun. 11, 2019

(65) Prior Publication Data

US 2020/0395328 A1    Dec. 17, 2020

(51) Int. Cl.
*H01L 23/00*    (2006.01)
*H01L 25/00*    (2006.01)
(Continued)

(52) U.S. Cl.
CPC ........ *H01L 24/32* (2013.01); *H01L 21/76802* (2013.01); *H01L 21/76877* (2013.01);
(Continued)

(58) Field of Classification Search
CPC ... H01L 24/32; H01L 21/76802; H01L 24/33; H01L 24/83; H01L 25/18; H01L 25/50; H01L 27/11526; H01L 27/11556
(Continued)

(56) References Cited

U.S. PATENT DOCUMENTS

| 10,381,362 B1* | 8/2019 | Cui et al. ............... H01L 27/115 |
| 2015/0235949 A1* | 8/2015 | Yu et al. ............... H01L 23/5283 |
| | | 257/774 |

(Continued)

FOREIGN PATENT DOCUMENTS

CN    109417075    3/2019

OTHER PUBLICATIONS

Shilov Anton, "Yangtze Memory Unveils Xtacking Architecture for 3D NAND: Up to 3 Gbps I/O", retrieved from the Internet: https://www.anandtech.com/show/13166/yangtze-memory-unveils-xtacking-architecture-for-3d-nand-up-to-3-gbps-io [copy retrieved May 9, 2019], 2 pages.

(Continued)

*Primary Examiner* — Thinh T Nguyen
(74) *Attorney, Agent, or Firm* — Compass IP Law PC

(57) ABSTRACT

An integrated circuit memory includes a logic circuitry bonded to a memory array. For example, the logic circuitry is formed separately from the memory array, and then the logic circuitry and the memory array are bonded. The logic circuitry facilitates operations of the memory array and includes complementary metal-oxide-semiconductor (CMOS) logic components, such as word line drivers, bit line drivers, sense amplifiers for the memory array. In an example, instead of being bonded to a single memory array, the logic circuitry is bonded to and shared by two memory arrays. For example, the logic circuitry is between two memory arrays. Due to the bonding process, a bonding interface layer is formed. Thus, in such an example, a first bonding interface layer is between the logic circuitry and a first memory array, and a second bonding interface layer is between the logic circuitry and a second memory array.

17 Claims, 21 Drawing Sheets

(51) Int. Cl.
*H01L 21/768* (2006.01)
*H01L 27/11582* (2017.01)
*H01L 27/11556* (2017.01)
*H01L 27/11526* (2017.01)
*H01L 27/11573* (2017.01)
*H01L 25/18* (2006.01)

(52) U.S. Cl.
CPC .............. *H01L 24/33* (2013.01); *H01L 24/83* (2013.01); *H01L 25/18* (2013.01); *H01L 25/50* (2013.01); *H01L 27/11526* (2013.01); *H01L 27/11556* (2013.01); *H01L 27/11573* (2013.01); *H01L 27/11582* (2013.01); *H01L 2224/29187* (2013.01); *H01L 2224/32145* (2013.01); *H01L 2224/33181* (2013.01); *H01L 2224/83895* (2013.01); *H01L 2224/83896* (2013.01); *H01L 2924/05042* (2013.01); *H01L 2924/05442* (2013.01); *H01L 2924/1431* (2013.01); *H01L 2924/14511* (2013.01)

(58) Field of Classification Search
USPC .................. 257/314, 315; 438/201, 202, 257
See application file for complete search history.

(56) References Cited

U.S. PATENT DOCUMENTS

2015/0340316 A1   11/2015   Or-Bach et al.
2019/0043836 A1   2/2019    Fastow et al.

OTHER PUBLICATIONS

European Search Report dated Sep. 4, 2020 for European Patent Application No. 20162733.8, 8 pages.

* cited by examiner

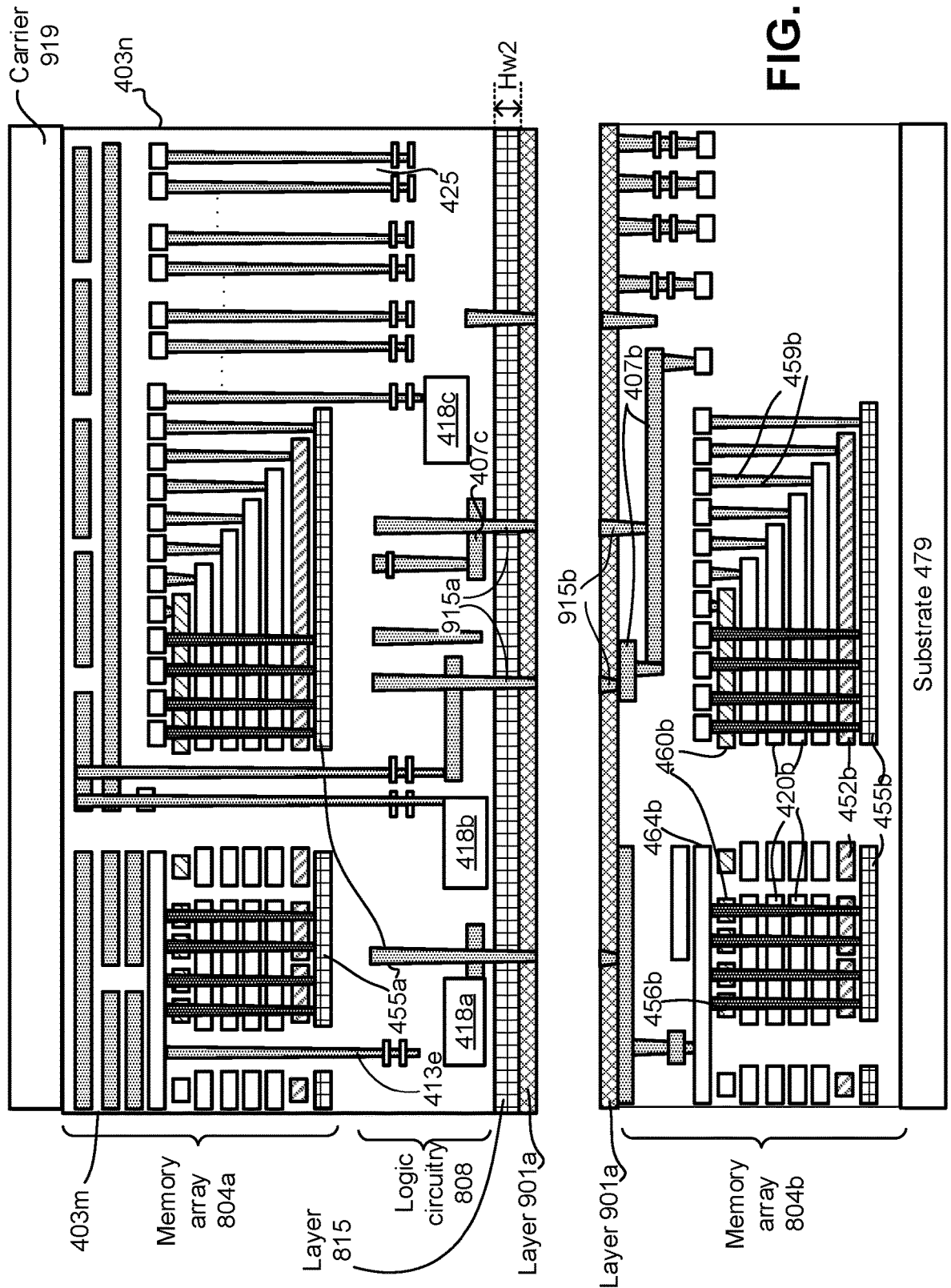

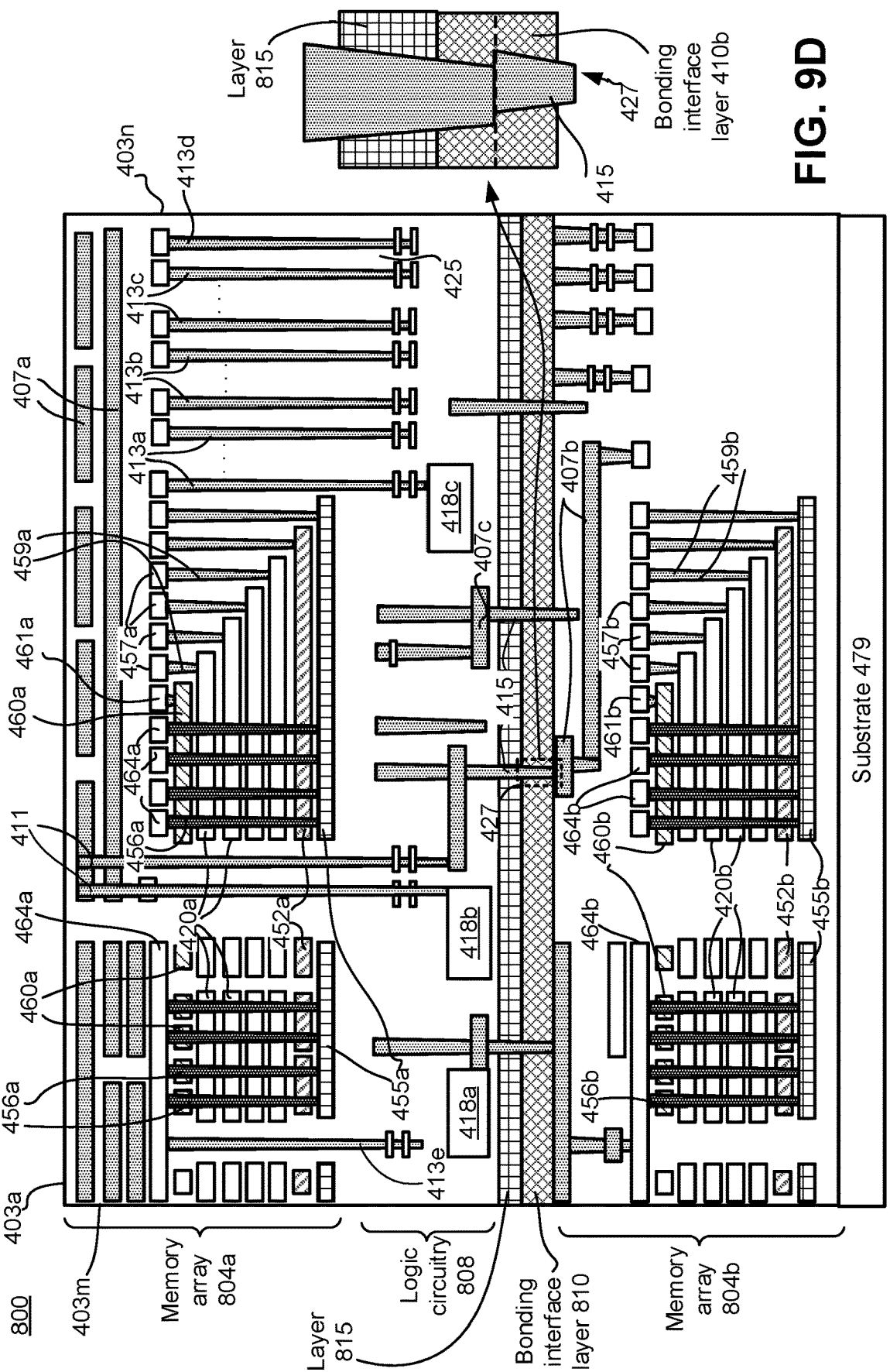

MEMORY ARRAYS WITH BONDED AND SHARED LOGIC CIRCUITRY

BACKGROUND

Flash memory, such as NAND flash memory, is a non-volatile storage medium. A flash memory array generally is coupled to logic circuits that facilitate operations of the memory array. The logic circuits have components such as word line drivers, bit line drivers, and sense amplifiers for the memory array. The logic circuits, for example, include complementary metal-oxide-semiconductor (CMOS) logic. Often times, thermal cycles of the process for formation of the memory array adversely affect the logic circuits. As will be appreciated in light of this disclosure and explained in turn, there exists a number of non-trivial issues associated with decreasing complexity, power consumption, and/or cost (e.g., cost per bit of memory) of the logic circuits, as well as avoiding the adverse effects of thermal cycles of the memory array processing on the logic circuits.

BRIEF DESCRIPTION OF THE DRAWINGS

FIGS. 9A, 9B, 9C, and 9D collectively illustrate a method for forming a memory structure comprising a first memory array, a second memory array, and logic circuitry, wherein a bonding interface layer is interposed between the second memory array and the logic circuitry, without any such bonding interface layer between the first memory array and the logic circuitry, in accordance with some embodiments.

DETAILED DESCRIPTION

Figure 1:
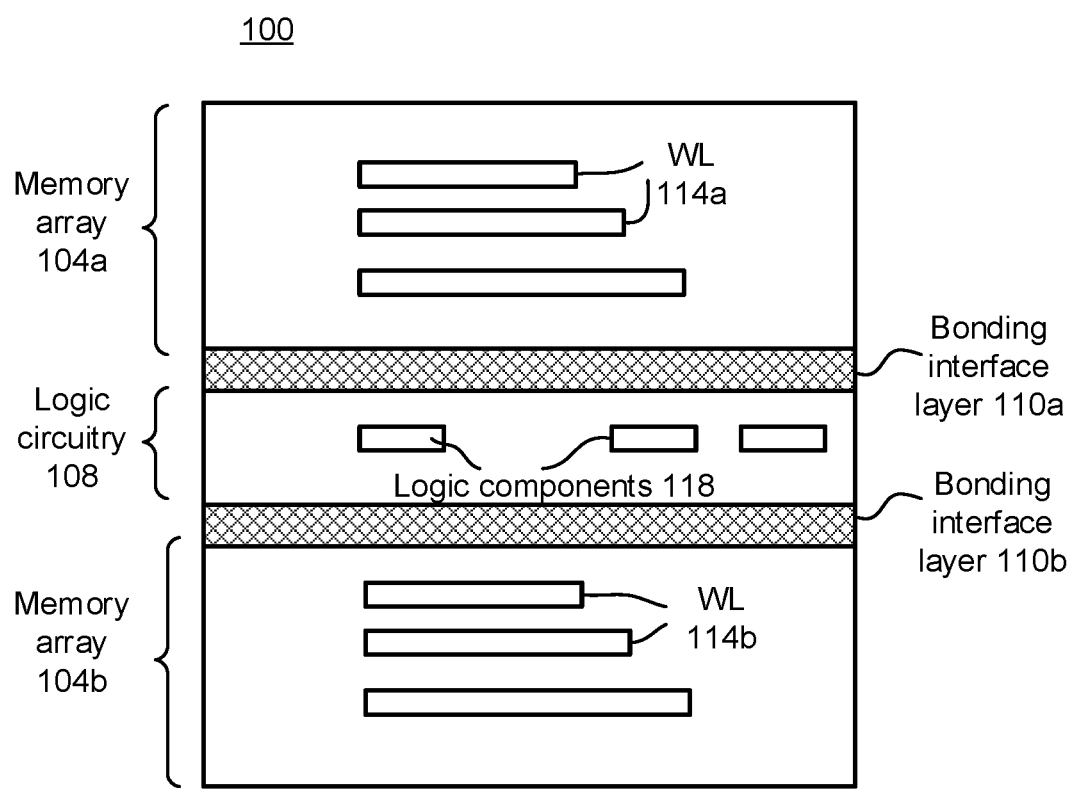
FIG. 1 illustrates a cross-sectional view of an integrated memory structure comprising a first memory array, a second memory array, and logic circuitry, wherein a first bonding interface layer is between the first memory array and the logic circuitry, and a second bonding interface layer is between the second memory array and the logic circuitry, in accordance with some embodiments.

An integrated memory structure is disclosed herein, which includes multiple memory arrays, such as flash memory arrays, sharing a common logic circuitry. In some embodiments, the shared logic circuitry is interposed between a first memory array and a second memory array. In an example, the first memory array and the second memory array are processed and formed separately from the logic circuitry. Subsequent to formation of the memory arrays and the logic circuitry, the logic circuitry is bonded to the first memory array and the second memory array. Thus, in an example, the integrated memory structure includes a first die comprising the first memory array, a second die comprising the second memory array, and a third die comprising the logic circuitry, where the third die is between the first and second dies, and the third die is bonded to each of the first and second dies.

In an example, a first layer is deposited on a surface of the logic circuitry that is to be bonded with the memory array, and a second layer is deposited on a surface of the memory array that is to be bonded with the logic circuitry. Each of the first and second layer comprises, for example, an oxide material (such as silicon dioxide), a nitride material (such as silicon nitride), an oxynitride material (such as silicon oxynitride), and/or the like. The first and second layers are cleaned and polished, pre-bonded with one another, and annealed at an elevated temperature, thereby bonding the first and second layers to form a bonding interface layer. Thus, in the integrated memory structure, the logic circuit and the memory array are separated by the bonding interface layer. As discussed, the bonding interface layer comprises silicon dioxide, silicon nitride, silicon oxynitride, or other suitable electrically-insulating bonding material. Although the thickness of the bonding interface layer can vary, in some embodiments it has a thickness in the range of 3000 angstroms to 10 microns. Thus, in the integrated memory structure that includes logic circuitry between, and bonded to, two memory arrays, a first bonding interface layer is between the logic circuitry and a first memory array, and a second bonding interface layer is between the logic circuitry and a second memory array.

In some examples, the bonding between the logic circuitry and a memory array may be formed using fusion bonding or hybrid bonding. As will be discussed in further detail in turn, in fusion bonding, the bonding process is between the first and second layers (and not between any conductive material such as metal). For example, in fusion bonding (which is also referred to as direct bonding), no conductive structure (e.g., vias including metal) extends through the first and second layers, while these layers are being bonded to form the bonding interface layer. After the bonding is completed, via holes are formed extending through the bonding interface layer and are filled with metal, thereby forming interconnect structures between the logic circuitry and the memory array through the bonding interface layer. Because the vias are formed through the bonding interface layer subsequent to the first and second layers being bonded, sections of an interconnect structure extending through the bonding interface layer do not have any misalignment or offset (no unlanded portions), as will be discussed in further detail in turn.

In contrast to fusion bonding and as will be discussed in further detail in turn, in hybrid bonding, the bonding process is between the first and second layers and also between conductive structures within the first layer and conductive structures within the second layer. For example, in hybrid bonding, conductive structure (e.g., a via including metal) extends through each of the first and second layers, prior to these layers being bonded to form the bonding interface layer. For example, a first interconnect structure extends through the first layer and is exposed through, and flush with, a surface of the first layer; and a second interconnect structure extends through the second layer and is exposed through, and flush with, a surface of the second layer (e.g., prior to the bonding process). During the bonding process, surfaces of the first layer and the second layers bond to form a bonding interface layer, along with a bonding or contact of the first interconnect structure and the second interconnect structure. In an example, due to unintentional practical considerations of the bonding process, the memory array and the logic circuitry may not be perfectly aligned during the bonding process, and hence, the first interconnect structure and the second interconnect structure may not be perfectly aligned while being bonded. Accordingly, sections of a combined interconnect structure formed through the bonding or contact of the first and second interconnect structures, which extend through the bonding interface layer, may have some misalignment or offset, as will be discussed in further detail in turn.

Bonding the logic circuitry with two memory arrays and sharing the logic circuitry among the two memory arrays have several advantages. For example, sharing the logic circuitry among the memory arrays reduces complexity and/or power consumption of the logic circuitry. For example, a single shared voltage divider block of the logic circuitry can be used for both the memory arrays. Sharing the logic circuitry among the memory arrays also reduces cost of the logic circuitry per bit of memory. Thus, the cost of the logic circuitry is amortized across two memory arrays, thereby resulting in cost savings. Also, due to the use of the bonding process between the logic circuitry and the memory arrays, it is possible to separate the logic circuitry processing from the memory array processing, so that the logic circuitry is not affected by the thermal cycles of the process of memory array formation. Also, forming the memory arrays and the logic circuitry independently and separately reduces overall cycle time to manufacture the integrated memory structure.

Instead of bonding the logic circuitry with each of the two memory arrays according to some embodiments, in another example embodiment, the logic circuitry can be bonded with a single memory array. For example, the memory array and the logic circuitry are formed separately and then bonded (e.g., using fusion bonding or hybrid bonding). Thus, formation of the logic circuitry is separate from formation of the memory array, so that the logic circuitry is not affected by thermal cycles of the process of memory array formation.

In an example embodiment, instead of bonding the logic circuitry with each of two memory arrays, the logic circuitry is formed to be integrated with a first memory array (e.g., instead of bonding separately formed logic circuitry and the first memory array, a combined structure is formed that includes both the logic circuitry and the first memory array). After the combination of the first memory array and the logic circuitry is formed, the combination is then bonded with a second memory array. In the final memory structure, the logic circuitry is interposed between the first and second memory arrays. A bonding interface layer is between the logic circuitry and the second memory array (in other words, the combination of the first memory array and the logic circuitry is bonded with the second memory array). However, no such bonding interface layer is present between the logic circuitry and the first memory array. This alternate forming process still allows the logic circuitry to be shared among the first and second memory arrays, thereby reducing complexity, power consumption, and/or a cost per bit of the logic circuitry, as previously discussed herein.

As discussed herein, terms referencing direction, such as upward, downward, vertical, horizontal, left, right, front, back, etc., are used for convenience to describe embodiments of integrated circuits having a base or substrate extending in a horizontal plane. Embodiments of the present disclosure are not limited by these directional references and it is contemplated that integrated circuits and device structures in accordance with the present disclosure can be used in any orientation.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same Elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Note that, as used herein, the expression "X includes at least one of A or B" refers to an X that may include, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items are included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Elements referred to herein with a common reference label followed by a particular number or alphabet may be collectively referred to by the reference label alone. For example, in FIG. 1 discussed herein later, memory arrays 104a, 104b may be collectively and generally referred to as memory arrays 104 in plural, and memory array 104 in singular.

Architectures

FIG. 1 illustrates a cross-sectional view of an integrated memory structure 100 (also referred to as a structure 100) comprising a first memory array (also referred to as an "array") 104a, a second memory array 104b, and logic circuitry 108, wherein a first bonding interface layer 110a is between the first array 104a and the logic circuitry 108, and a second bonding interface layer 110b is between the second array 104b and the logic circuitry 108, in accordance with some embodiments.

In an example, each of the arrays 104a, 104b comprises any appropriate three-dimensional (3D) memory array, such as a floating gate flash memory array, a charge-trap (e.g., replacement gate) flash memory array, a phase-change memory array, a resistive memory array, an ovonic memory array, a ferroelectric transistor random access memory (Fe-TRAM) array, a nanowire memory array, or any other 3D memory array. In one example, each of the memory arrays 104a, 104b is a stacked NAND flash memory array, which stacks multiple floating gate or charge-trap flash memory cells in a vertical stack wired in a NAND (not AND) fashion. In another example, the 3D memory arrays 104a, 104b include NOR (not OR) storage cells.

The array 104a comprises word lines (WLs) 114a, and the array 104b comprises WLs 114b. Although three WLs are illustrated for each of the arrays 104, the arrays can have any appropriate number of WLs.

Three example logic components 118 of the logic circuitry 108 are symbolically illustrated in FIG. 1. Examples of logic components 118 include, but are not limited to, address decoders, state machines, buffers, word line drivers, bit line drivers, sense amplifiers, voltage dividers, charge pumps, digital logic blocks, logic gates, switches, inverters, adders, multipliers, etc. In an example, one or more of the logic components 118 include complementary metal-oxide-semiconductor (CMOS) logic. In an example, the logic circuitry 108 may also be referred to as "CMOS logic," "CMOS circuitry," and/or the like, due to presence of CMOS circuits within the logic circuitry 108. In an example, the logic circuitry 108 includes high voltage logic components (e.g., components and/or transistors that operate at a relatively high voltage, such as in the range of 5 V to 30 V) and/or low voltage logic components (e.g., components and/or transistors that operate at a relatively low voltage, such as in the range of 0.9 V to 5 V).

The structure 100 is symbolically illustrated in high level in FIG. 1, without illustrating various internal components within the arrays 104a, 104b and the logic circuitry 108—further detail of the arrays 104a, 104b and the logic circuitry 108 will be discussed in turn.

As will be discussed in further detail in turn, the array 104a, the array 104b, and the logic circuitry 108 are formed and processed separately. Subsequently, the array 104a and the logic circuitry 108 are bonded (e.g., using wafer to wafer bonding, die to die bonding, wafer to die bonding, or die to wafer bonding), thereby forming the bonding interface layer 110a. Thus, in an example, bonding the array 104a and the logic circuitry 108 is accomplished by bonding the wafers together that include these components, and then dicing the wafers (e.g., wafer to wafer bonding). In another example, bonding the array 104a and the logic circuitry 108 is accomplished by bonding a die comprising the array 104a and a die comprising the logic circuitry 108 (e.g., die to die bonding). In yet another example, bonding the array 104a and the logic circuitry 108 is accomplished by bonding a wafer comprising the array 104a and a die comprising the logic circuitry 108, and then dicing the wafer (e.g., wafer to die bonding). In yet another example, bonding the array 104a and the logic circuitry 108 is accomplished by bonding a wafer comprising the logic circuitry 108 and a die comprising the array 104a, and then dicing the wafer (e.g., wafer to die bonding). Similarly, the array 104b and the logic circuitry 108 are bonded (e.g., using wafer to wafer bonding, die to die bonding, wafer to die bonding, or die to wafer bonding), thereby forming the bonding interface layer 110b. Thus, each of the bonding interface layers 110a, 110b are remnant of the bonding process between the logic circuitry 108 and the corresponding array 104.

In an example embodiment, the bonding between the logic circuitry 108 and the arrays 104 are performed at a relatively later part of the process used in forming the structure 100. For example, as will be discussed in further detail in turn, the logic circuitry 108 is processed and formed independent of, and separate from, the processing and forming of the arrays 104. That is, the logic circuitry 108 and the arrays 104 are processed and formed prior to the bonding between the logic circuitry 108 and the arrays 104. Subsequently, the logic circuitry 108 and the arrays 104 are bonded (e.g., thereby forming the bonding interface layers 110).

In some embodiments, interconnect structures electrically coupling the logic circuitry 108 and the arrays 104 are formed after the bonding process (e.g., in case fusion bonding is employed, as will be discussed in turn), while in some other embodiments, at least part of the interconnect structures are formed prior to the bonding process (e.g., in case hybrid bonding is employed, as will be discussed in turn).

In an example, the logic circuitry 108 is shared among the arrays 104a, 104b. For example, at least some of the logic components 118 are shared and used for both the arrays 104a, 104b.

Bonding the logic circuitry 408 with the two arrays 104a, 104b, and sharing the logic circuitry 108 among the two arrays 104a, 104b have several advantages. For example, as discussed previously, sharing the logic circuitry 108 among the arrays 104a, 104b reduces complexity and/or power consumption of the logic circuitry 108. For example, a single shared voltage divider block can be used for both the arrays 104a, 104b. Sharing the logic circuitry 108 among the arrays 104a, 104b also reduces cost of the logic circuitry 108 (e.g., cost of the logic circuitry per bit of memory). Thus, the cost of the logic circuitry 108 is amortized across two memory arrays, thereby resulting in cost savings. Also, due to the use of the bonding process between the logic circuitry 108 and the arrays 104, it is possible to separate the logic circuitry processing from the array processing, so that the logic circuitry 108 is not affected by the thermal cycles of the process of memory array formation. Also, forming the arrays 104 and the logic circuitry 108 independently and separately reduces overall cycle time to manufacture the structure 100.

Figure 2A:
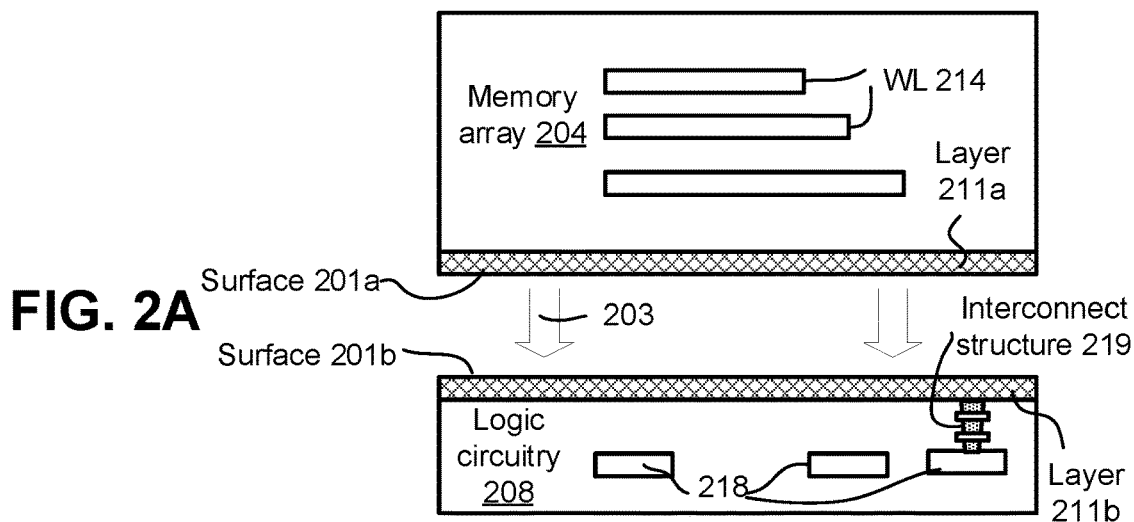
FIGS. 2A-2C illustrate an example process of bonding, using a fusion bonding process, a memory array and logic circuitry, thereby forming a bonding interface layer between the memory array and the logic circuitry, in accordance with some embodiments.
Figure 2B:
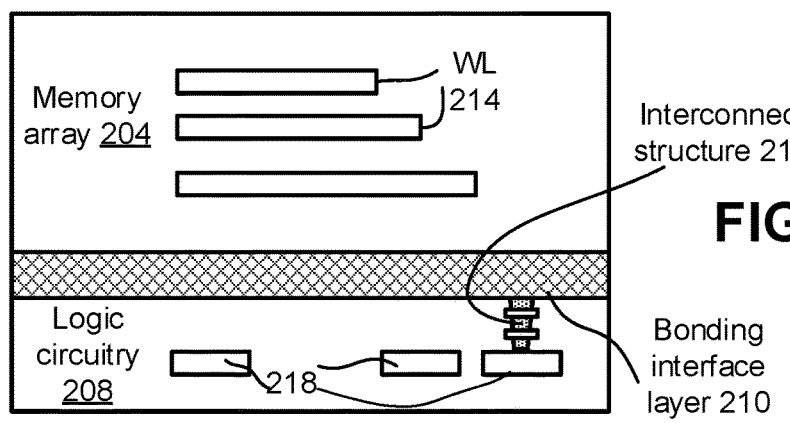
Figure 2C:
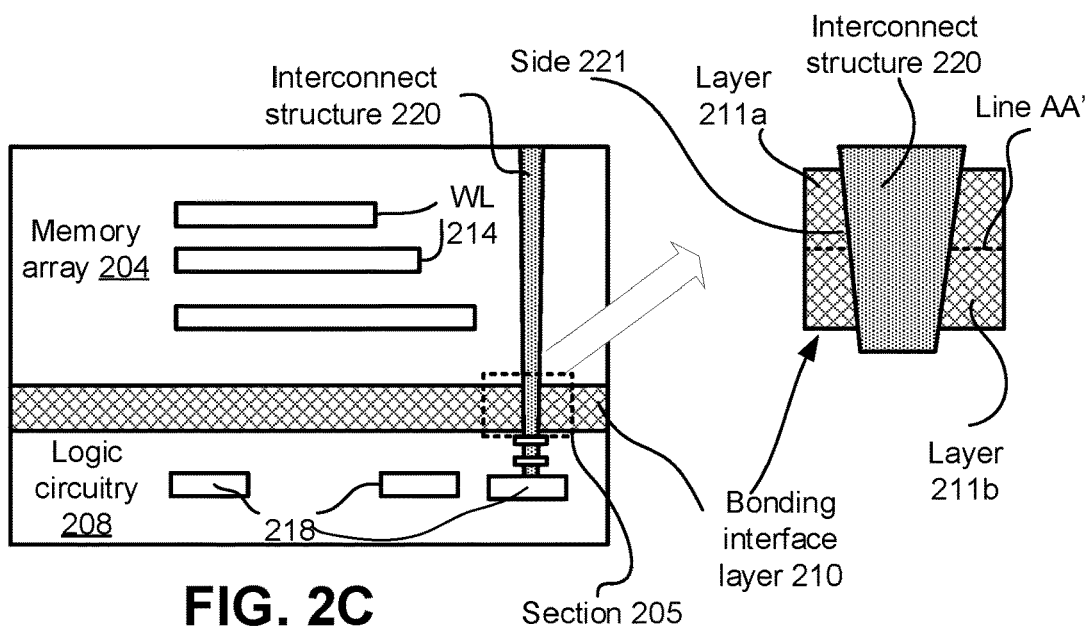

FIGS. 2A-2C illustrate an example process of bonding, using a fusion bonding process, a memory array 204 and logic circuitry 208, thereby forming a bonding interface layer 210, in accordance with some embodiments. In an example, the memory array 204 of FIGS. 2A-2C can be any of the memory arrays 104a, 104b of FIG. 1 (or any other memory array discussed herein), the logic circuitry 208 of FIGS. 2A-2C can be the logic circuitry 108 of FIG. 1 (or any other logic circuitry discussed herein), and the bonding interface layer 210 of FIGS. 2A-2C can be any of the bonding interface layers 110a, 110b of FIG. 1 (or any other bonding interface layer discussed herein).

Similar to FIG. 1, in FIGS. 2A-2C the array 204 comprises example WLs 214. Three example logic components 218 of the logic circuitry 208 are also symbolically illustrated in FIGS. 2A-2C.

Referring to FIG. 2A, the array 204 and the logic circuitry 208 are formed separately. In some embodiments, one or both the array 204 and the logic circuitry 208 may be in a wafer level, i.e., on a corresponding wafer, while they are being bonded. In some other embodiments, one or both the array 204 and the logic circuitry 208 may be in a die level (i.e., singulated and separated in individual dies), while they are being bonded.

The array 204 has a layer 211a on a bottom surface of the array 204 that is to be bonded to the logic circuitry 208, and the logic circuitry 208 has a layer 211b on a top surface of the logic circuitry that is to be bonded to the array 204. That is, the layers 211a, 211b are to be bonded. The layers 211a, 211b will be discussed in further detail later. The arrows 203 in FIG. 2A symbolically indicate that the array 204 and the logic circuitry 208 are to be bonded.

As illustrated in FIG. 2A, no interconnect structure comprising conductive material (e.g., such as metal) extends through the layers 211a, 211b. For example, FIG. 2A illustrates an example interconnect structure 219 that extends from a logic component 218 to the layer 211b, but the interconnect structure 219 does not extend through the layer 211b. Thus, a surface 201b of the layer 211b (e.g., which faces away from the logic circuitry 208) does not have any metal or other conductive material protruding through the layer 211b. Similarly, a surface 201a of the layer 211a (e.g., which faces away from the array 204) does not have any metal or other conductive material protruding through the layer 211a.

FIG. 2B illustrates a combined structure where the array 204 and logic circuitry 208 have bonded, to form the bonding interface layer 210. The bonding between the array 204 and logic circuitry 208 is performed using fusion bonding (also referred to as direct bonding). In fusion bonding, the smooth surfaces 201a and 201b of the layers 211a, 211b, respectively, are first polished, smoothed, and/or cleaned (e.g., made free of any impurity). Then the layers 211a, 211b are pre-bonded, e.g., at room temperature. Subsequently, the layers 211a, 211b are annealed, e.g., at elevated temperature, such that the layers 211a, 211b bond to form the bonding interface layer 210. In another example, any other appropriate type of process flow may be employed for the fusion bonding process.

In an example, each of the layers 211a, 211b, 210 comprises silicon and oxygen. For example, the bonding interface layer 210 is Silicon dioxide ($SiO_2$). In an example, each of the layers 211a, 211b, 210 comprises silicon and nitrogen. For example, the bonding interface layer 210 is Silicon Nitride ($Si_3N_4$). In another example, any other appropriate material, that are employed for fusion or direct bonding, may be used for the bonding interface layer 210.

In an example, a thickness of the bonding interface layer 210 is within a range of about 3000 angstroms to 10 microns. The thickness of the bonding interface layer 210 can be based on the material used for the bonding interface layer 210, a size of the surfaces 201 of the layers 211, a level of purity or cleanliness of the surfaces 201 prior to bonding, desired degree of electrical isolation between the logic circuitry 208 and memory array 204, and/or desired degree of structural integrity.

In an example, during the bonding process, the layers 211a, 211b are bonded to form the single bonding interface layer 210, where the individual layers 211a, 211b are not separately discernable in the bonding interface layer 210. In another example, the individual layers 211a, 211b are separately discernable in the bonding interface layer 210. For instance, there may be a visible seam between layers 211a, 211b.

In an example, in the fusion bonding process, prior to the bonding, no metal or other conductive material extends through the layer 211a on the surface 201a, and no metal or other conductive material extends through the layer 211b on the surface 201b. That is, the fusion bonding of FIGS. 2A-2B is between the layers 211a and 211b, without any bonding or attachment between two conductive materials (in contrast, a hybrid bonding process involves bonding between conductive materials, as will be discussed in turn).

Referring now to FIG. 2C, a plurality of interconnect structures are formed through the bonding interface layer 210, and a single example interconnect structure 220 is illustrated in FIG. 2C. The interconnect structure 220 is formed using deep via etch, such that a through hole via is formed through the array 204 and the bonding interface layer 210, and the via is filled with conductive material such as metal. The interconnect structure 220 can be coupled to the interconnect structure 219 of FIG. 2B, e.g., to form a continuous interconnect structure between the array 204 and the logic circuitry 208.

FIG. 2C further illustrates a magnified view of a section 205, which comprises a section of the bonding interface layer 210 and the interconnect structure 220. For example, in the magnified view, an imaginary line AA' passes through the bonding interface layer 210, and divides the bonding interface layer 210 in the layers 211a and 211b. The interconnect structure 220 passes through the line AA'. Also illustrated is a side 221 of the interconnect structure 220. Because the interconnect structure 220 is formed after the bonding process, there is no discontinuity, offset or misalignment in the side 221 of the interconnect structure 220, in the section of the interconnect structure 220 passing the line AA'. As will be discussed herein in turn, if, for example, hybrid bonding is employed instead of fusion bonding, then a side of the interconnect layer may have some discontinuity or misalignment.

Figure 3A:
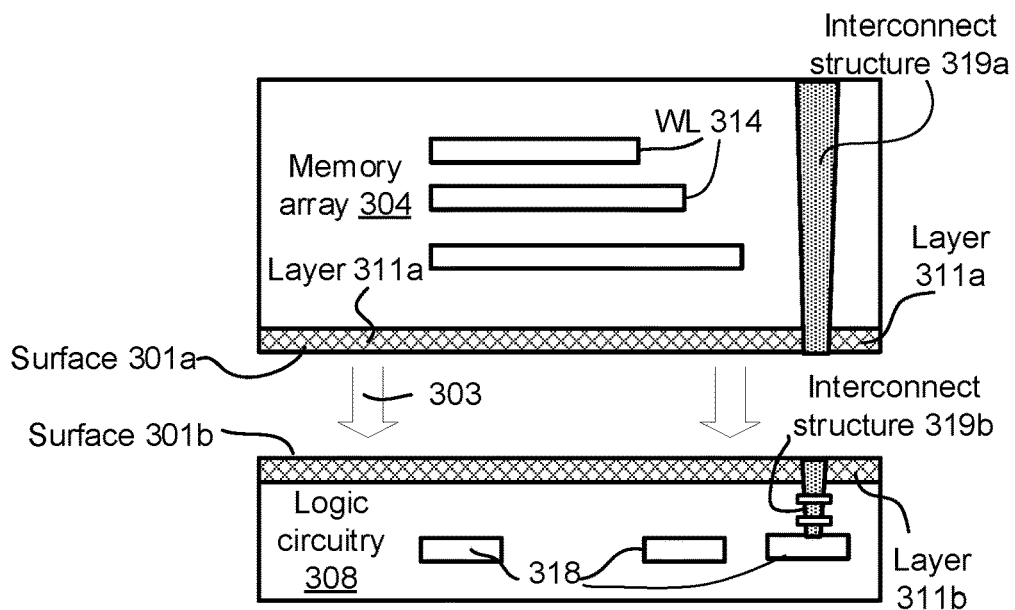
FIGS. 3A-3B illustrate an example process of bonding, using a hybrid bonding process, a memory array and logic circuitry, thereby forming a bonding interface layer between the memory array and the logic circuitry, in accordance with some embodiments.
Figure 3B:
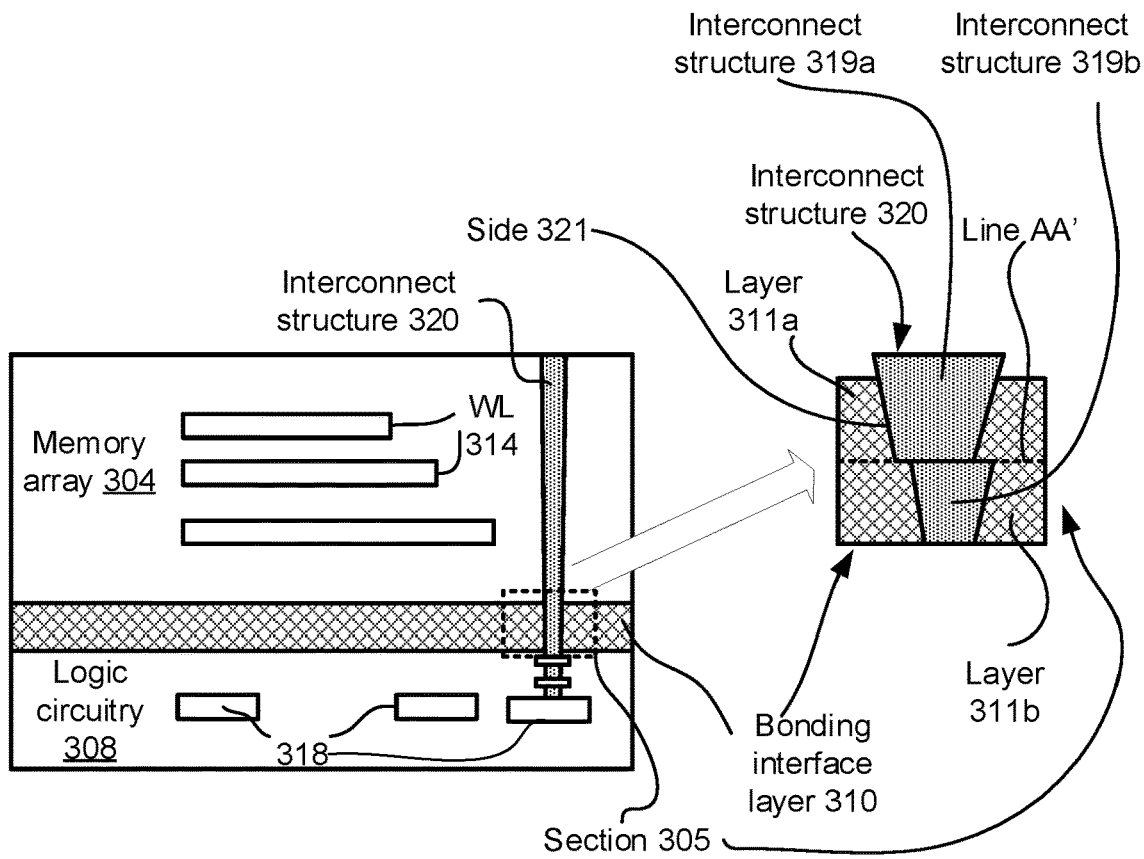

FIGS. 3A-3B illustrate an example process of bonding, using hybrid bonding process, a memory array 304 and logic circuitry 308, thereby forming a bonding interface layer 310, in accordance with some embodiments. In an example, the memory array 304 of FIGS. 3A-3B can be any of the memory arrays 104a, 104b of FIG. 1 (or any other memory array discussed herein), the logic circuitry 308 of FIGS. 3A-3B can be the logic circuitry 108 of FIG. 1 (or any other logic circuitry discussed herein), and the bonding interface layer 310 of FIGS. 3A-3B can be any of the bonding interface layers 110a, 110b of FIG. 1 (or any other bonding interface layer discussed herein).

Similar to FIG. 1, in FIGS. 3A-3B, the array 304 comprises example WLs 314. Three example logic components 318 of the logic circuitry 308 are symbolically illustrated in FIGS. 3A-3B.

Referring to FIG. 3A, the array 304 and the logic circuitry 308 are formed separately. In some embodiments, one or both the array 304 and the logic circuitry 308 may be in a wafer level, i.e., part of a corresponding wafer; while in some other embodiments, one or both the array 304 and the logic circuitry 308 may be in a die level (i.e., singulated and separated in individual dies).

The array 304 has a layer 311a on a bottom surface of the array 304 that is to be bonded to the logic circuitry 308, and the logic circuitry 308 has a layer 311b on a top surface of the logic circuitry that is to be bonded to the array 304a. That is, the layers 311a, 311b are to be bonded. The layers 311a, 311b may be similar to the layers 211a, 211b discussed with respect to FIGS. 2A-2C. The arrows 303 in FIG. 3A symbolically indicate that the array 304 and the logic circuitry 308 are to be bonded.

In an example, a plurality of interconnect structures comprising conductive material (e.g., such as metal) extend through the layers 311a, and 311b. For example, FIG. 3A illustrates an example interconnect structure 319a comprising conductive material (e.g., such as metal) extends through the layer 311a; and an interconnect structure 319b comprising conductive material (e.g., such as metal) extends through the layer 311b. Thus, a surface 301a of the layer 311a (e.g., which faces away from the array 304) has a plurality of metal or other conductive materials exposed through the layer 311a (such as the tip of the interconnect structure 319a being exposed through the surface 301a). The tip of the interconnect structure 319a is flush or co-planar with the surface 301a of the layer 311a, as illustrated. In an example, the layer 311a is polished or cleaned, to make the tip of the interconnect structure 319a flush or co-planar with the surface 301a of the layer 311a.

Similarly, a surface 301b of the layer 311b (e.g., which faces away from the logic circuitry 208) has a plurality of metal or other conductive materials exposed through the layer 311b (such as the tip of the interconnect structure 319b protruding or exposed through the surface 301b).

FIG. 3B illustrates a combined structure where the array 304 and logic circuitry 308 have bonded, to form the bonding interface layer 310. The bonding between the array 304 and logic circuitry 308 is performed using hybrid bonding. As previously discussed with respect to FIGS. 2A-2C, in fusion bonding, the bonding is between the two layers 211a, 211b, without any bonding between metals or other conductive material exposed through the bonding surfaces of these two layers. In contrast, in hybrid bonding, the layers 311a, 311b are bonded, along with attachment or contact between corresponding conductive materials exposed through the bonding surfaces of these two layers. For example, in the hybrid bonding of FIG. 3B, the layers 311a, 311b are bonded, along with attachment, bonding or contact between conductive materials of the tips of the interconnect structures 319a, 319b respectively exposed through the bonding surfaces of the layers 311a, 311b. Thus, the interconnect structures 319a, 319b are in contact in FIG. 3B, thereby forming a combined interconnect structure 320.

Similar to fusion bonding, in the hybrid bonding, the smooth surfaces 301a and 301b of the layers 311a, 311b, respectively, and the exposed tips of the interconnect structures 319a, 319b are polished, smoothed, and/or cleaned (e.g., made free of any impurity). Then the layers 311a, 311b are pre-bonded, e.g., at room temperature. Subsequently, the layers 311a, 311b are annealed, e.g., at elevated temperature, such that the layers 311a, 311b bond to form the bonding interface layer 310. In another example, any other appropriate process flow may be employed for the hybrid bonding process.

In an example, the layers 311a, 311b, 310 may be similar to those discussed with respect to FIGS. 2A-2C. For example, each of the layers 311a, 311b, 310 comprises silicon and oxygen, e.g., comprises Silicon dioxide ($SiO_2$). In an example, each of the layers 311a, 311b, 310 comprises silicon and nitrogen, e.g., comprises Silicon Nitride ($Si_3N_4$). In another example, any other appropriate material, generally used for hybrid bonding, may be used for the bonding interface layer 310. In an example, a thickness of the bonding interface layer 310 is within a range of about 3000 angstrom to 1 micron.

In an example, during the bonding process, the layers 311a, 311b are bonded to form the single bonding interface layer 310, where the individual layers 311a, 311b are not separately discernable in the bonding interface layer 310. In another example, the individual layers 311a, 311b are separately discernable in the bonding interface layer 310.

FIG. 3B further illustrates a magnified view of a section 305, which comprises a section of the bonding interface layer 310 and the interconnect structure 320. For example, in the magnified view, an imaginary line AA' passes through the bonding interface layer 310, and divides the bonding interface layer 310 into the layers 311a and 311b. The interconnect structure 320 passes through the line AA'. Also illustrated is a side 321 of the interconnect structure 320. The interconnect structure 320 comprises the interconnect structures 319a, 319b. Ideally, if the array 304 and the logic circuitry 308 are perfectly aligned during the bonding process, the interconnect structures 319a, 319b would also be perfectly aligned. However, due to unintentional practical considerations of the bonding process, the array 304 and the logic circuitry 308 may not be perfectly aligned during the bonding process, and hence, the interconnect structures 319a, 319b may also not be perfectly aligned in the interconnect structure 320. For example, the magnified view of the section 305 shows misalignment or offset between two sections of the interconnect structure 320 passing through the bonding interface layer 310, as illustrated in FIG. 3B. The misalignment or offset may inherently be an unintended consequence of hybrid bonding process. As discussed with respect to FIG. 2C, no such misalignment or offset will be present if the fusion bonding is employed instead.

In an example, as illustrated in FIG. 3B, sections of the interconnect structure 320 passing through the bonding interface layer 310 are misaligned, and hence, sections of the misaligned interconnect structure 320 are exposed (e.g., a section of a bottom surface of the interconnect structure 319a is not coupled to a top surface of the interconnect structure 319b). Accordingly, in an example, the bonding interface layer 310 includes a diffusion barrier for the exposed sections of the interconnect structure 320. In such an example, the bonding interface layer 310 comprises Silicon (Si), Carbon (C), Nitrogen (N), and/or Oxygen (O) (e.g., a Si—C—N—O system), e.g., in addition to, or instead of, the examples of material for the bonding interface layer 310 provided herein previously. That is, the bonding interface layer 210 includes dielectric with composition mixture of silicon, carbon, nitrogen, and/or oxygen, which is used to enable good bonding, as well as to form a diffusion barrier to the misaligned (and hence exposed) metal (e.g., copper) of the interconnect structure 320.

Figure 3C:
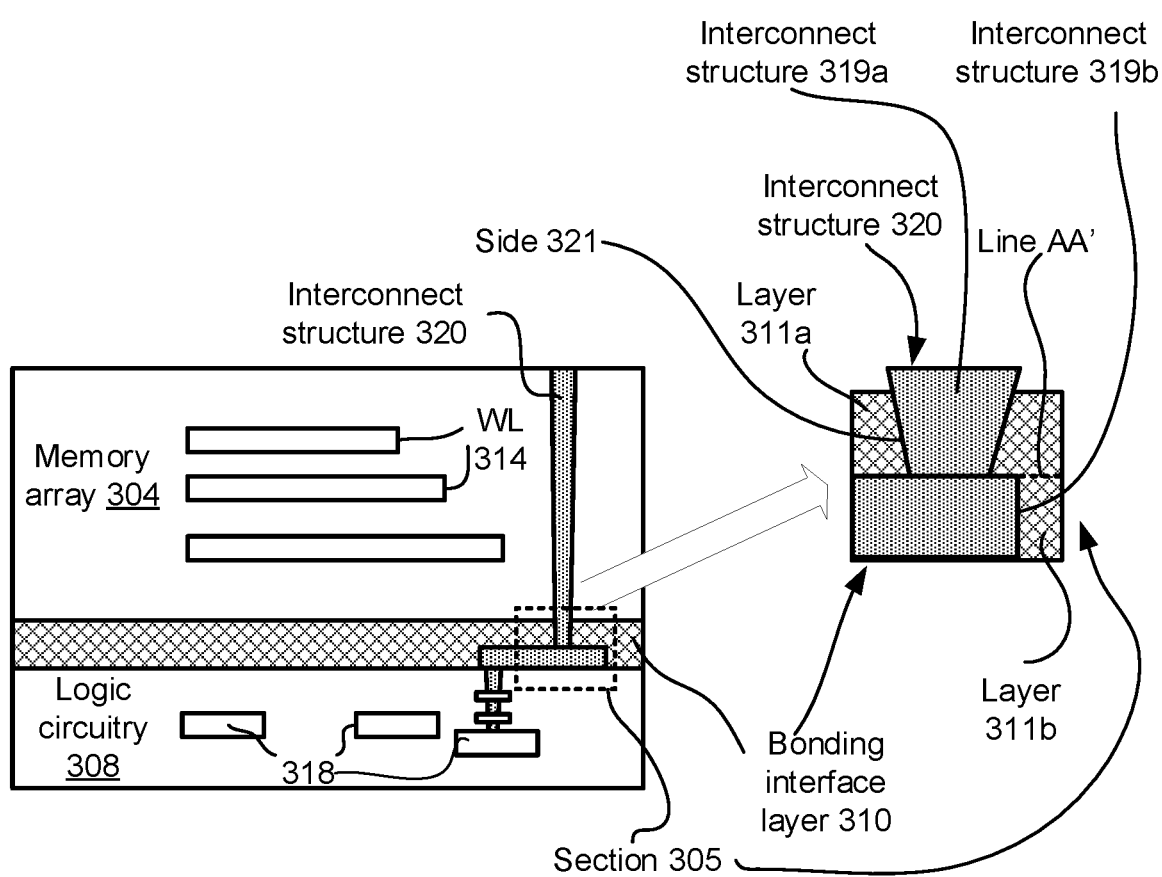
FIG. 3C illustrates an example process of bonding, using hybrid bonding process, a memory array and logic circuitry, thereby forming a bonding interface layer, where the hybrid bonding involves a via-to-line bonding, in accordance with some embodiments.

In FIGS. 3A-3B, the metal to metal bonding is a via-to-via bonding. However, hybrid bonding can involve via-to-line bonding as well. FIG. 3C illustrates an example process of bonding, using hybrid bonding process, a memory array 304 and logic circuitry 308, thereby forming a bonding interface layer 310, where the hybrid bonding involves a via-to-line bonding, in accordance with some embodiments. For example, the interconnect structure 319a includes a via comprising conductive material through the layer 311a, and the interconnect structure 319b includes a conductive line (e.g., metal line) through the layer 311b, and the conductive materials of the via and the lines are bonded during the hybrid bonding process.

Figure 4:
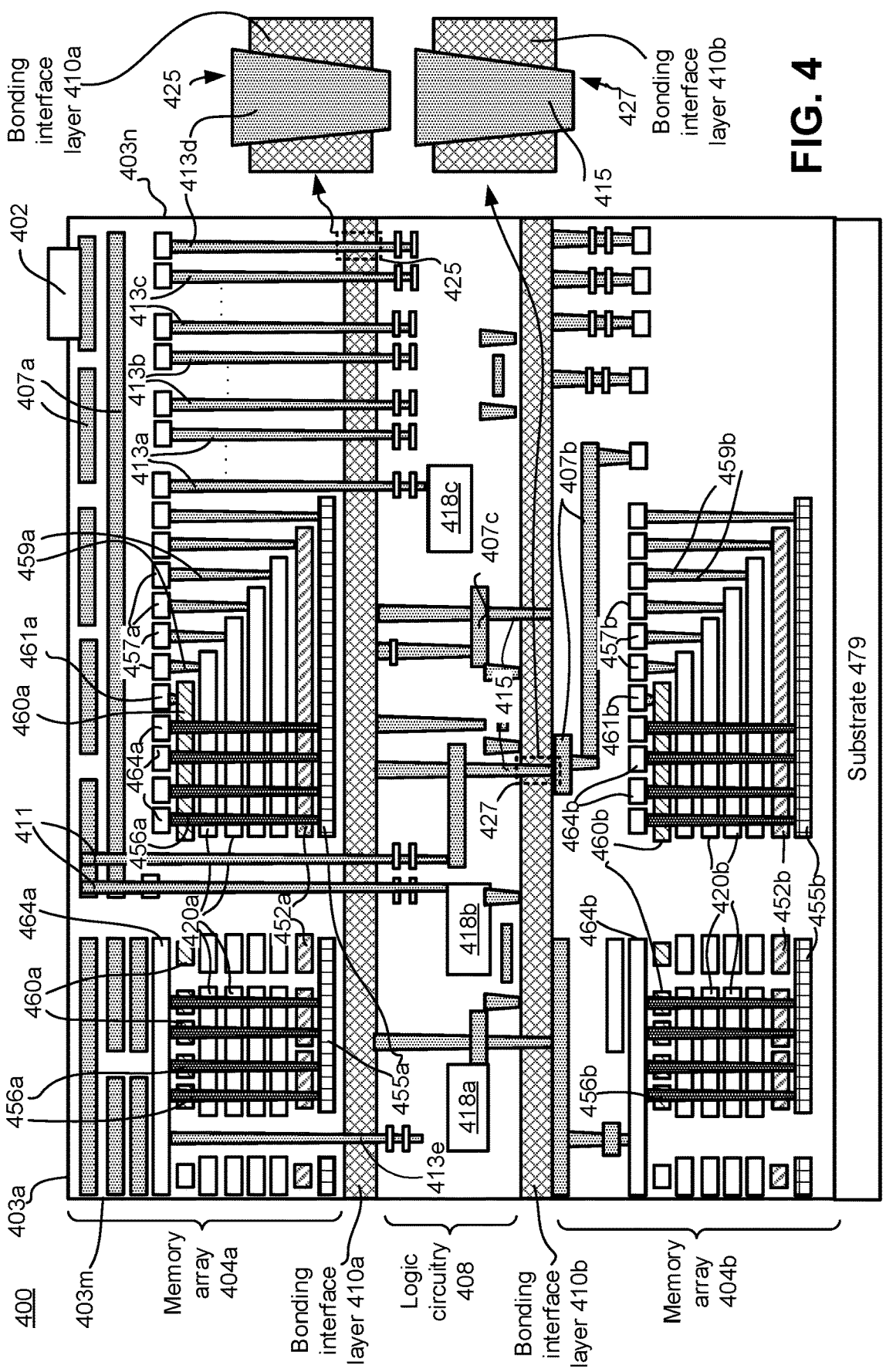
FIG. 4 illustrates a cross-sectional view of an integrated memory structure comprising a first memory array, a second memory array, and logic circuitry between the first and second memory arrays, wherein the logic circuitry is separated from the first and second memory arrays by way of first and second bonding interface layers, respectively, in accordance with some embodiments.

FIG. 4 illustrates a cross-sectional view of an integrated memory structure (also referred to as a structure 400) comprising a first memory array 404a, a second memory array 404b, and logic circuitry 408 between the first and second memory arrays, wherein the logic circuitry 408 is separated from the first and second memory arrays by way of first and second bonding interface layers 410a, 410b, respectively, in accordance with some embodiments. In an example, the arrays 404a, 404b and the logic circuitry 408 of FIG. 4 respectively correspond to the arrays 104a, 104b and the logic circuitry 108 of FIG. 1. Similarly, the bonding interface layers 410a, 410b respectively correspond to the bonding interface layers 110a, 110b of FIG. 1.

In an example, the bonding interface layer 410a is formed via fusion bonding (e.g., as discussed with respect to FIGS. 2A-2C) of the array 404a and the logic circuitry 408, and the bonding interface layer 410b is formed via fusion bonding of the array 404b and the logic circuitry 408. In an example, the bonding interface layers 410a, 410b are similar to the bonding interface layer 210 of FIGS. 2A-2C. For example, the bonding interface layers 410a, 410b comprise oxide material such as Silicon dioxide ($SiO_2$), nitride material such as Silicon Nitride ($Si_3N_4$), etc., although any other appropriate material that are used for bonding two wafer level components may also be used. In an example, a thickness of each of the bonding interface layers 410 is within a range of about 3000 angstrom to 1 micron.

Details of the memory arrays 404a, 404b are discussed herein below. However, such details are merely examples, and any appropriate modification of the internal structures of the arrays 404a, 404b may be appreciated by those skilled in the art.

The memory array 404b is formed on a substrate 479. The substrate 479, in an example, is a wafer on which multiple such arrays are formed. In an example, the bonding process is performed while the array 404b is still on the wafer, i.e., prior to dicing of the wafer. In another example, the bonding process is performed after the dicing of the wafer.

In an example, the array 404a includes memory cells, such as NAND flash memory cells, formed at memory pillars 456a. The array 404a further includes conductive access lines to enable access to the memory cells, such as bitlines 464a, e.g., which are coming out of the page in FIG. 4 (e.g., perpendicular to a plane of the paper), wordlines (WL) 420a, select gate source (SGS) 452a, and select gate drain (SGD) 460a. The wordlines 420a are staggered or arranged in a stair-case like pattern. The array 404a further includes current common source (SRC, also referred to as a source plate) 455a, located underneath the memory pillars 456a.

The array 404a further includes WL connection terminals 457a, each WL connection terminal 457a coupled to a corresponding WL 420a, e.g., via interconnect structures 459a. The array 404a further includes SDG connection terminals 461a, each SGD connection terminal 459a coupled to a corresponding SGD 460a, e.g., via interconnect structures 459a. The array 404a comprises a plurality of metallization levels 407a comprising metals, which electrically couple various components within the array 404a.

In an example embodiment, the structure 400 is accessed from a top surface 403a of the array 404a. For example, the array 404a comprises a plurality of interconnect structures 407a comprising one or more metallization levels. Interconnect terminals 402 (although merely one is illustrated in FIG. 4) are coupled to the surface of the array 404a, e.g., for connecting the structure 400 to external components.

In an example, one or more interconnect structures 411 pass through the array 404a and the bonding interface layer 410a, e.g., to electrically couple to the logic circuitry 408 and/or the array 404b. The interconnect structures 411 can be used to transmit signals to and/or from the logic circuitry 408 and/or the array 404b.

In an example, the array 404b has a structure that is at least in part similar to the structure of the array 404a. For example, the array 404b includes memory cells, such as NAND flash memory cells, formed at memory pillars 456b. The array 404b further includes conductive access lines to enable access to the memory cells, such as bitlines 464b, WL 420b, SGS 452b, and SGD 460b. The array 404b further includes SRC 455b, located underneath the memory pillars 456b.

The array 404b further includes WL connection terminals 457b, each WL connection terminal 457b coupled to a corresponding WL 420b, e.g., via interconnect structures 459b. The array 404b further includes SDG connection terminals 461b coupled to a corresponding SGD 460b, e.g., via interconnect structures 459b.

In an example embodiment, various interconnect structures 413 pass through the array 404a and the bonding interface layer 410b, and these interconnect structures 413 transmit access lines signals to and/or from the logic circuitry 408 and/or the array 404b. For example, interconnect structures 413a transmit SGD signals to and/or from SGD 460b of the array 404b (although merely two such interconnect structures 413a are illustrated in FIG. 4). Similarly, interconnect structures 413b transmit wordline signals to and/or from WLs 420b of the array 404b. Similarly, interconnect structures 413c transmit SGS signals to and/or from SGS 452b of the array 404b. Interconnect structure 413d transmits SRC signals to and/or from SRC 455b of the array 404b. Interconnect structure 413e transmits bitline signals to and/or from bitlines 464b of the array 404b. Thus, at least the interconnect structures 411, 413 extend through the bonding interface layer 410a.

In an example embodiment, the logic circuitry 408 includes various logic circuits, generally illustrated as logic components 418a, 418b, 418c. As discussed with respect to FIG. 1, examples of logic components 418 include, but are not limited to, address decoders, state machines, buffers, word line drivers, bit line drivers, sense amplifiers, voltage dividers, charge pumps, digital logic blocks, etc. In an example, one or more of the logic components 418 include CMOS logic. In an example, the logic circuitry 408 include high voltage logic components (e.g., components and/or transistors that operate at a relatively high voltage, such as in the range of 5 V to 30 V) and/or low voltage logic components (e.g., components and/or transistors that operate at a relatively low voltage, such as in the range of 0.9 V to 5 V). For example, the logic circuitry 408 includes n-channel metal-oxide semiconductor field-effect transistors (MOSFET), p-channel MOSFETs, or both.

Various interconnect structures 415 couple the logic circuitry 408 to the array 404b. For example, the interconnect structures 415 extend through the bonding interface layer 410b, thereby coupling the logic circuitry 408 and the array 404b.

Also illustrated in FIG. 4 is a magnified view of a section 425, where the section 425 includes a section of the bonding interface layer 410a and an interconnect structure 413 extending through the bonding interface layer 410a. As discussed with respect to FIGS. 2A-2C, the interconnect structure 413 extending through the bonding interface layer 410a does not have any discontinuity, offset or misalignment, e.g., as the array 404a and the logic circuitry 408 are bonded using fusion bonding in an example.

Also illustrated in FIG. 4 is a magnified view of a section 427, where the section 427 includes a section of the bonding interface layer 410b and an interconnect structure 415 extending through the bonding interface layer 410b. As discussed with respect to FIGS. 2A-2C, the interconnect structure 415 extending through the bonding interface layer 410b does not have any discontinuity, offset or misalignment, e.g., as the array 404b and the logic circuitry 408 are bonded using fusion bonding in an example.

In an example embodiment and as previously discussed herein, the bonding interface layer 410a separates the array 404a and the logic circuitry 408. For example, the structure 400 has a left sidewall 403m and an opposing right sidewall 403n (although "left" and "right" are merely for purposes of ease of identification, and not limiting), and the bonding interface layer 410a extends from the left sidewall 403m to the right sidewall 403n. Similarly, the structure 400 has a front wall and an opposing back wall (e.g., which are not visible and not labelled in FIG. 4, and which are perpendicular to the left and right sidewalls), and the bonding interface layer 410a extends from the front and back walls. That is, the structure 400 has a top surface and a bottom surface, and a plurality of walls or surfaces extending between the top and bottom surfaces—the bonding interface layer 410a divides the structure in its entirety such that the bonding interface layer 410a extends to each of the plurality of walls or surfaces. Similarly, the bonding interface layer 410b also divides the structure 400 in its entirety such that the bonding interface layer 410b extends to each of the plurality of walls or surfaces. In an example, a first die includes the array 404a, a second dies includes the logic circuitry 408, and a third die includes the array 404b, where the three dies are bonded using the bonding interface layers 410a, 410b, as discussed herein.

FIGS. 5A, 5B, 5C, 5D, 5E, and 5F collectively illustrate a method for forming a memory structure (such as the memory structure 400 of FIG. 4) comprising a first memory array (e.g., memory array 404a), a second memory array (e.g., memory array 404b), and logic circuitry (e.g., logic circuitry 408) interposed between the first and second memory arrays, wherein a first bonding interface layer (e.g., bonding interface layer 410a) is between the first memory array and the logic circuitry, and a second bonding interface layer (e.g., bonding interface layer 410b) is between the second memory array and the logic circuitry, in accordance with some embodiments.

Figure 5A:
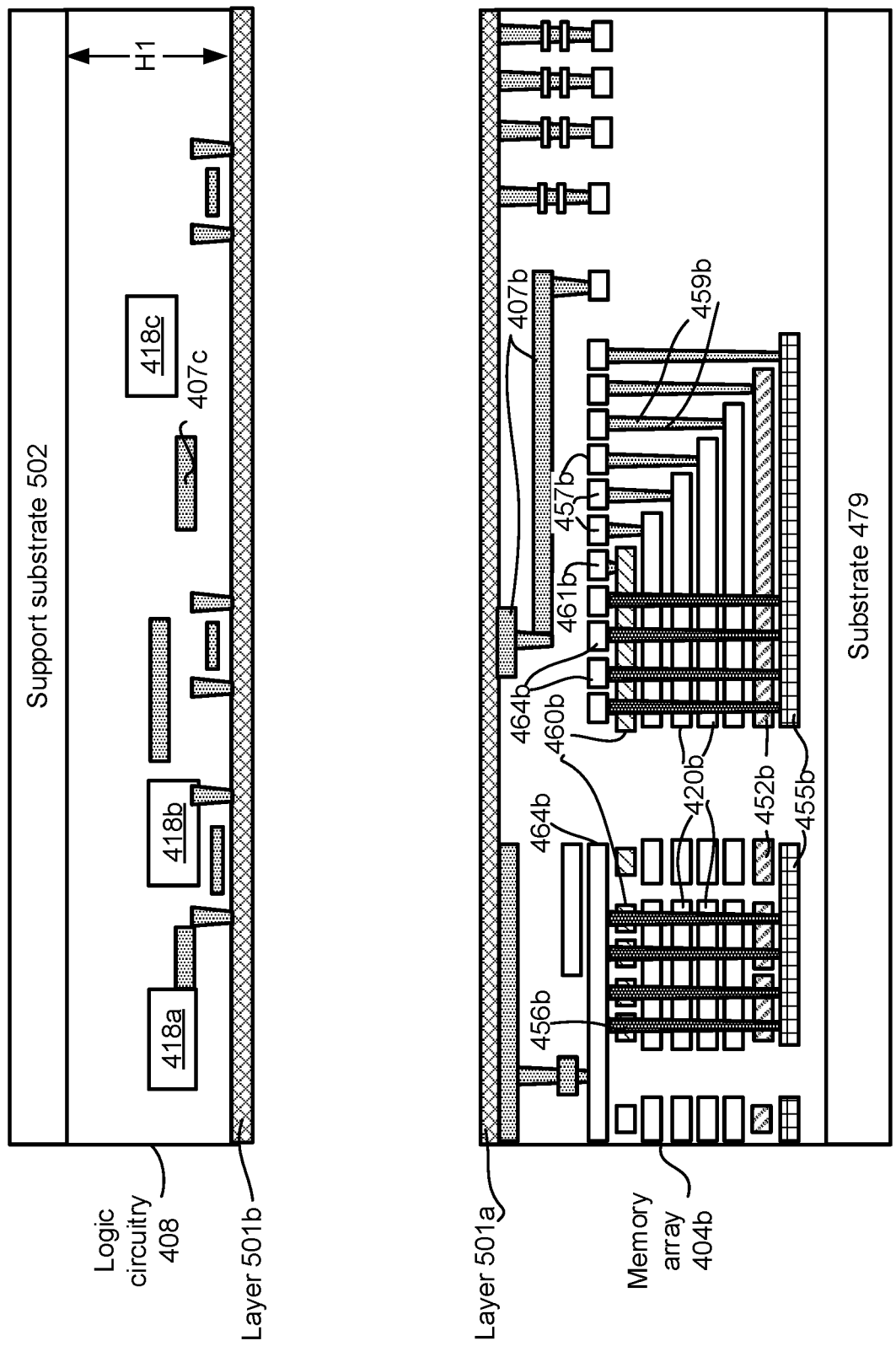
FIGS. 5A, 5B, 5C, 5D, 5E, and 5F collectively illustrate a method for forming a memory structure comprising a first memory array, a second memory array, and logic circuitry interposed between the first and second memory arrays, wherein a first bonding interface layer is between the first memory array and the logic circuitry, and a second bonding interface layer is between the second memory array and the logic circuitry, in accordance with some embodiments.

Referring to FIG. 5A, illustrated is the memory array 404b formed on the substrate 479. The substrate 479, in an example, is a wafer on which the array 404b is formed. The array 404 also comprises a layer 501a on a surface that is to be bonded with the logic circuitry 408, where the layer 501a may be similar to the layer 211a of FIG. 2A.

Also illustrated in FIG. 5A is the logic circuitry 408 formed on a support substrate 502. The substrate 502, in an example, is a wafer on which the logic circuitry 408 is formed, e.g., if the logic circuitry 408 is still on a wafer while bonding with the array 404b. In another example, the substrate 502 is a substrate of a die comprising the logic circuitry 408, e.g., if the die comprising the logic circuitry 408 is to be bonded with the array 404b. The logic circuitry 408 also comprises a layer 501b on a surface that is to be bonded with the array 404b, where the layer 501b may be similar to the layer 211b of FIG. 2A.

Figure 5B:
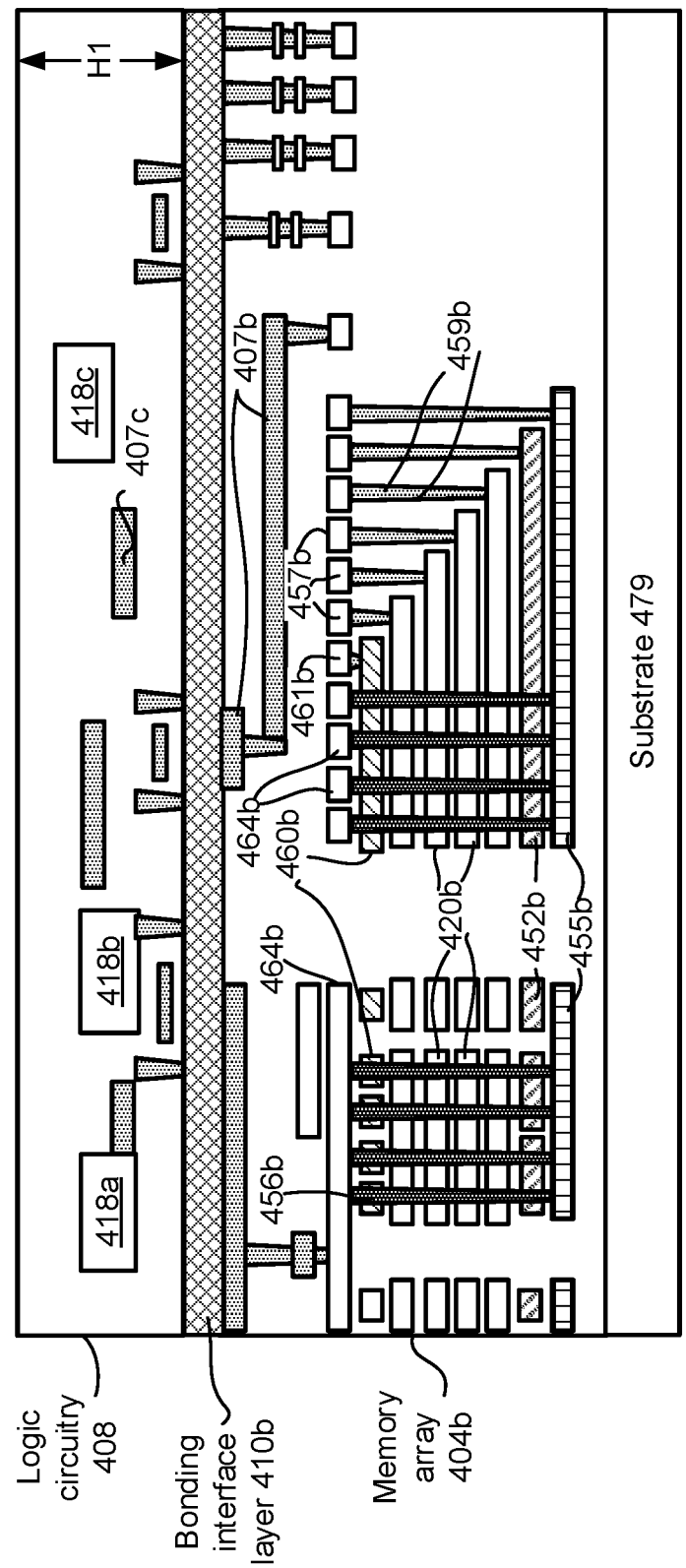

Referring now to FIG. 5B, the logic circuitry 408 is bonded with the array 404b, e.g., as discussed with respect to FIG. 2B. For example, the layers 501a, 501b are bonded to form the bonding interface layer 410b. A height of the logic circuitry 408 is H1, as illustrated. The support substrate 502 is then de-bonded from the logic circuitry 408.

Figure 5C:
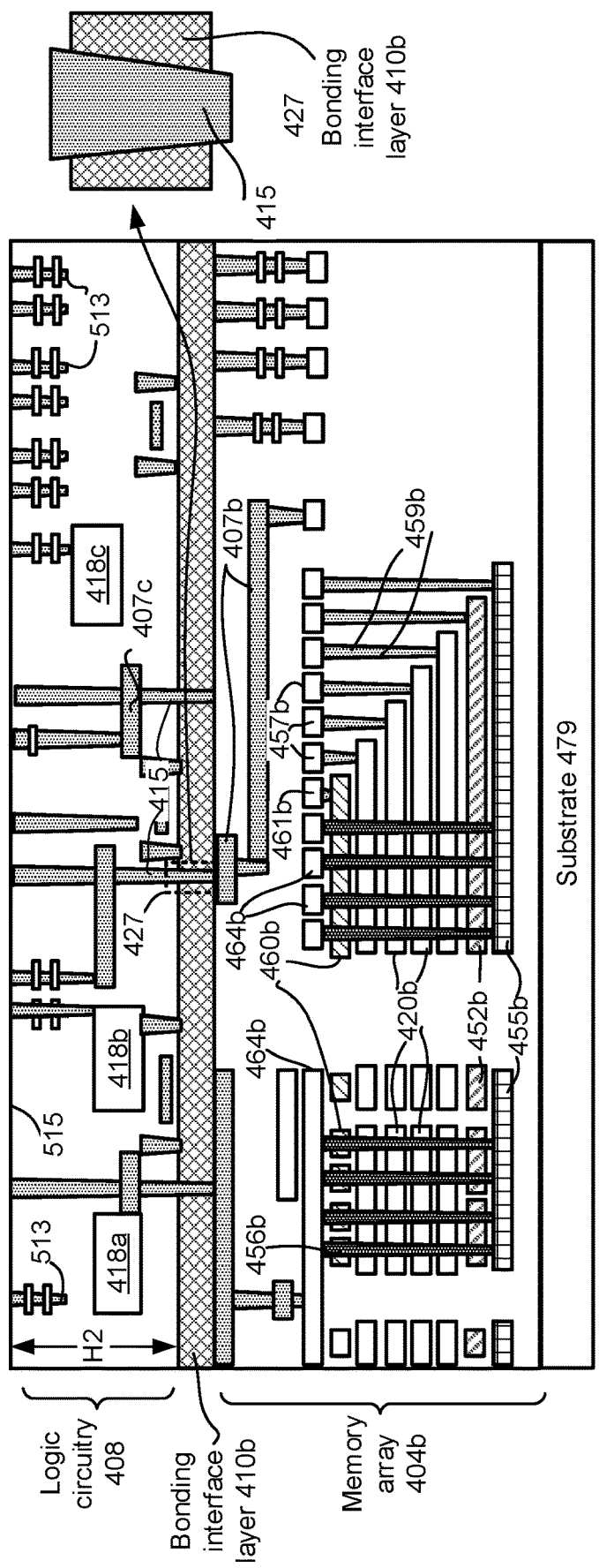

Referring now to FIG. 5C, various conductive structures or interconnect structures 513, 415, etc. are formed in the logic circuitry 408. Some of the conductive structures comprises conductive material (such as metal) deposited within vias that extend through the bonding interface layer 410b, such as conductive structures 415. For example, as the interconnect structures 415 are formed after formation of the bonding interface layer 410b, there are no offset or misalignment in the interconnect structures 415, as illustrated in the magnified view of the section 427.

The logic circuitry 408 comprises a surface 515 that is opposite to the surface of the logic circuitry 408 to which the array 404b is bonded (e.g., the surface 515 was attached to the support substrate 502 in FIG. 5A). Some of the interconnect structures have ends adjacent to, or exposed through, the surface 515 of the logic circuitry 408. In an example embodiment, the interconnect structures 415, 513 are formed by accessing the logic circuitry 408 through the surface 515. In an example embodiment, various metallization levels, vias, interconnect structures are formed within the logic circuitry 408, resulting in an increase of a height of the logic circuitry 408. For example, in FIGS. 5A-5B, the height of the logic circuitry 408 is H1, whereas after formation of the interconnect structures the height increases to H2 in FIG. 5C.

Figure 5D:
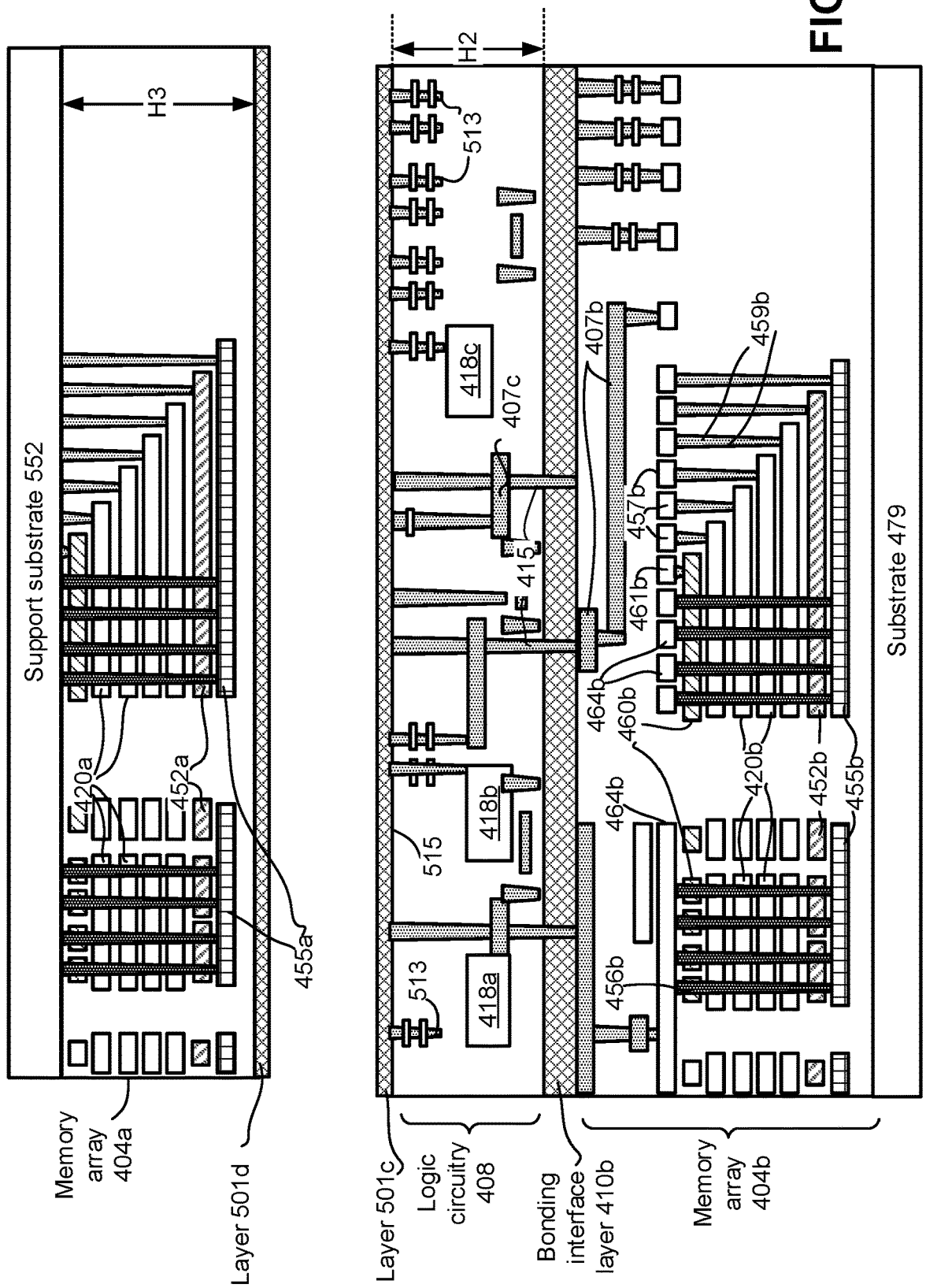

Referring now to FIG. 5D, layer 510c is formed on the surface 515 of the logic circuitry 408, where the layer 510c is similar to the layers 211 of FIG. 2A. Also illustrated in FIG. 5D is the array 404a, with a layer 501d formed on a surface that is to be bonded to the logic circuitry 408. The array 404a may be supported by a support substrate 552, which may be a wafer for example (e.g., if the wafer supporting the array 404a has not been diced yet).

The layer 510d is similar to the layers 211 of FIG. 2A. A height of the array 404a is H3, as illustrated in FIG. 5D. Note that for purposes of illustrative clarity, some of the components of the array 404a, which are labelled in FIG. 4, are not labelled in FIG. 5D (or in some of the subsequent figures).

Figure 5E:
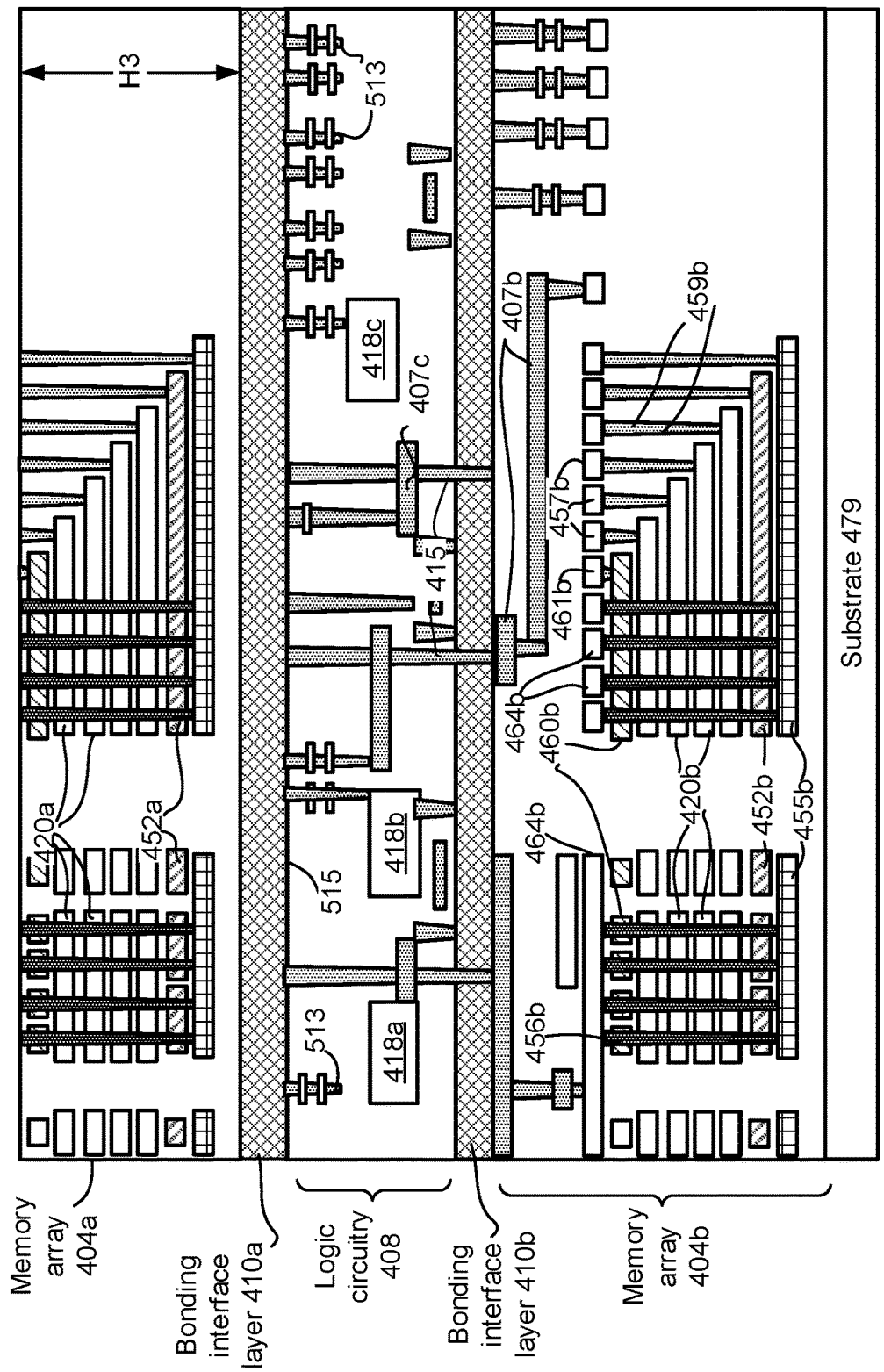

Referring now to FIG. 5E, the logic circuitry 408 is bonded with the array 404a, e.g., as discussed with respect to FIG. 2B, and the support substrate 552 is de-bonded from the array 404a. For example, the layers 501c, 501d are bonded to form the bonding interface layer 410a.

Figure 5F:
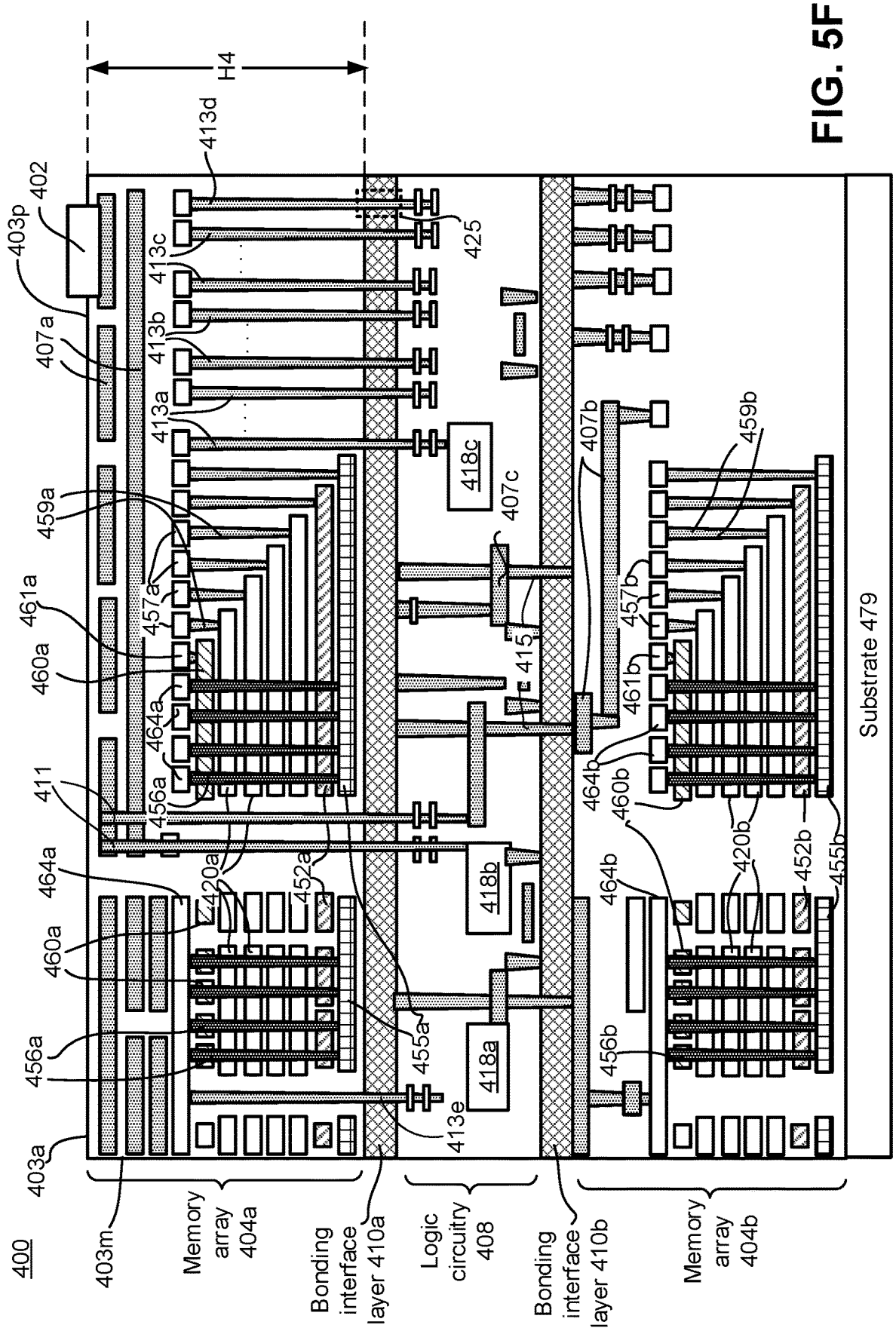

Referring now to FIG. 5F, interconnect structures 411, 413 are formed in the array 404a, e.g., using deep via etch. For example, deep through hole vias are formed that extends through the array 404a and the bonding interface layer 410a, and are filled with conductive material, such as metal, to form the interconnect structures 411, 413. In an example, such a through hole via is formed over a corresponding interconnect structure 513 of the logic circuitry 408 (e.g., where the interconnect structure 513 is formed in FIG. 5C), such that the conductive material within the via and the interconnect structure 513, in combination, form the interconnect structure 413.

Furthermore, various metallization levels, various terminals (e.g., such as WL connection terminals 457a, SDG connection terminals 461a, etc.), etc. are formed near a top of the array 404a, e.g., which extends a height of the array 404a. For example, the array 404a in FIG. 5F has a height H4 that is greater than the height H3 of the array 404a in FIG. 5E. That is, at least a section of the array 404a is formed after the array 404a is bonded with the logic circuitry 408. The resultant structure 400 of FIG. 5F is similar to the structure 400 of FIG. 4.

Thus, in FIGS. 4 and 5A-5E, the array 404b and the logic circuitry 408 of the structure 400 are bonded using fusion bonding, and the logic circuitry 408 and the array 404a are also bonded using fusion bonding. Thus, interconnect structures extending through a bonding interface layer 410 is formed after the corresponding components are bonded. However, in another example embodiment, one or both the bonding in the structure 400 may be hybrid bonding (e.g., as discussed with respect to FIGS. 3A-3E). In such embodiments, the interconnect structures are pre-formed through the layers 501a, 501b and/or layers 501c, 501d, and the hybrid bonding bonds the corresponding interconnect structures.

Figure 6:
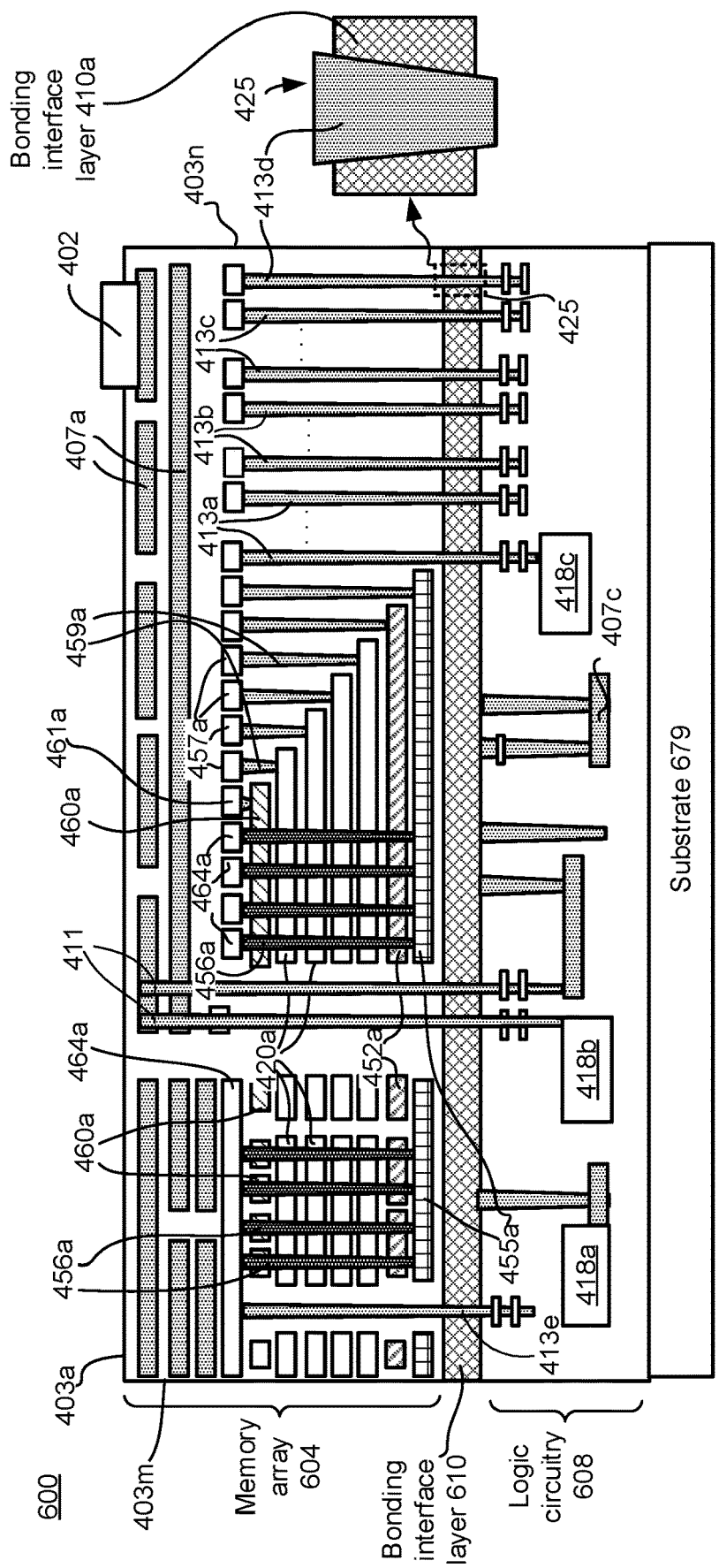
FIG. 6 illustrates a cross-sectional view of a memory structure comprising a memory array and logic circuitry, wherein a bonding interface layer is interposed between the memory array and the logic circuitry, in accordance with some embodiments.

FIG. 6 illustrates a cross-sectional view of a memory structure 600 (also referred to as a structure 600) comprising a memory array 604 and logic circuitry 608, wherein a bonding interface layer 610 is interposed between the memory array 604 and the logic circuitry 608, in accordance with some embodiments.

In an example, the memory array 604 of FIG. 6 is at least in part similar to the memory array 404a of FIG. 4, and accordingly, similar components in the two memory arrays are labelled using similar labels, and also individual components within the memory array 604 of FIG. 6 are not discussed in detail. In an example, the logic circuitry 608 of FIG. 6 is at least in part similar to the logic circuitry 408 of FIG. 4, and accordingly, similar components in the two logic circuitries are labelled using similar labels, and also individual components within the logic circuitry 608 of FIG. 6 are not discussed in detail.

In FIG. 4, the logic circuitry 408 was interposed between two arrays 404a, 404b. In contrast, the logic circuitry 608 of FIG. 6 is bonded to a single array 604. In an example, the bonding between the logic circuitry 608 and the array 604 is performed using fusion bonding, thereby forming the bonding interface 610 (e.g., which is similar to the bonding interfaces 410 of FIG. 4). The logic circuitry 408 is formed on a substrate 679.

Figure 7A:
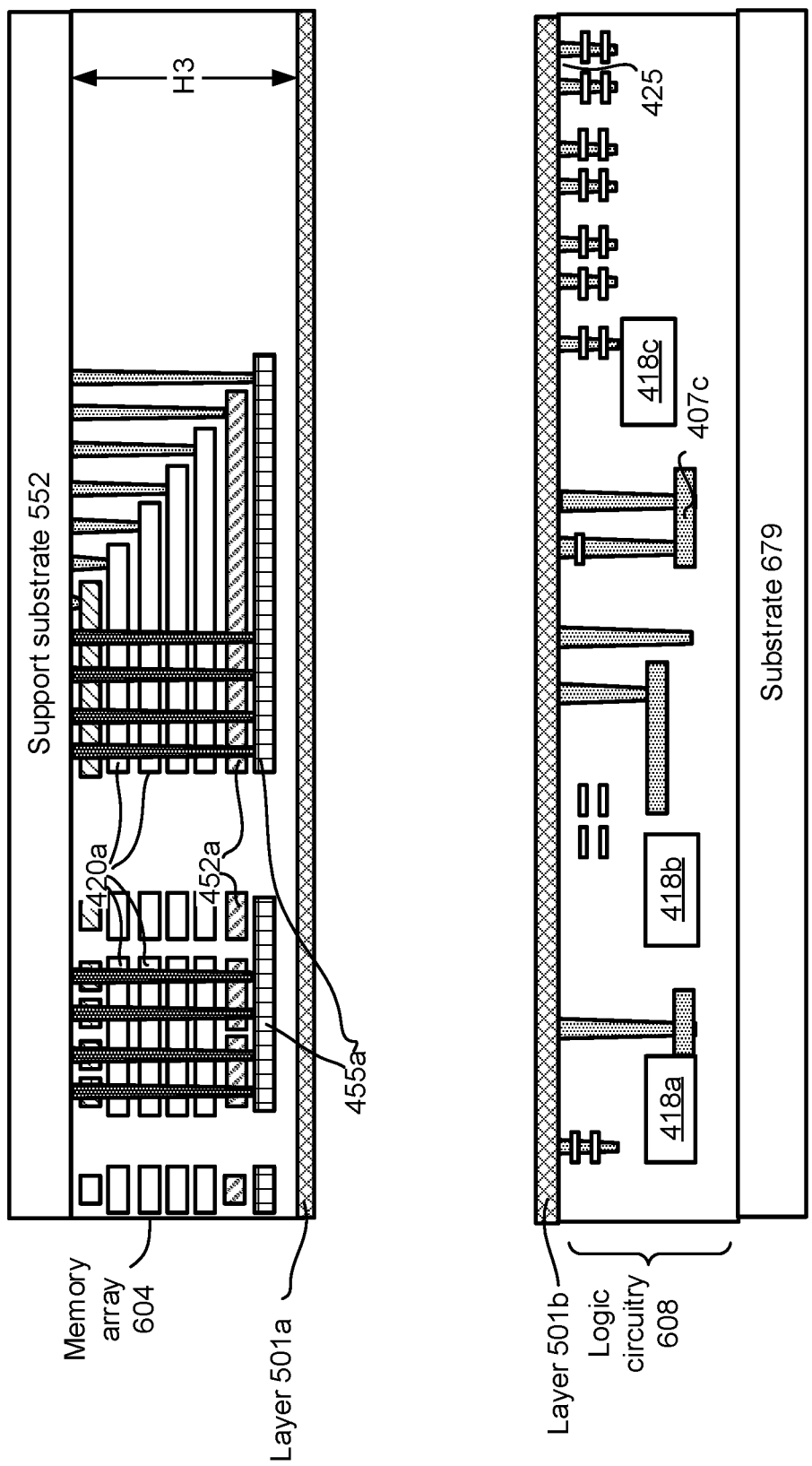
FIGS. 7A, 7B, and 7C collectively illustrate a method for forming a memory structure comprising a memory array and logic circuitry, wherein a bonding interface layer is between the memory array and the logic circuitry, in accordance with some embodiments.
Figure 7B:
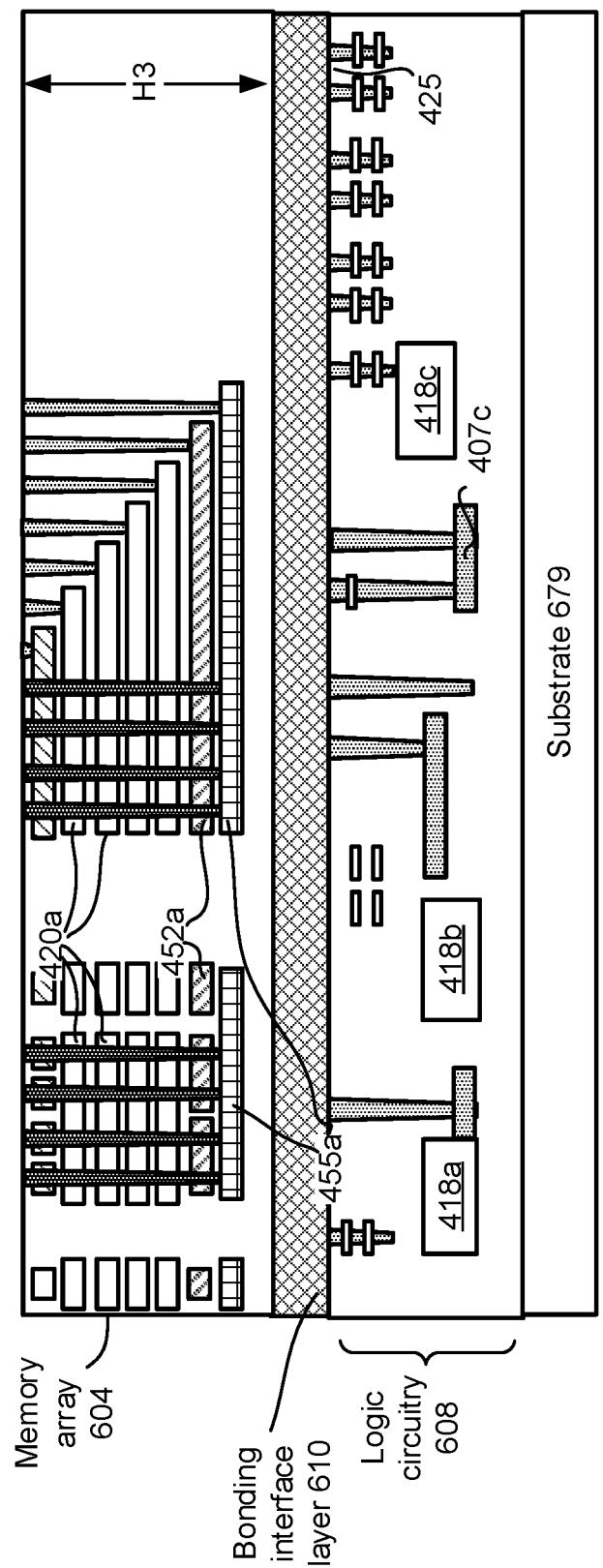
Figure 7C:
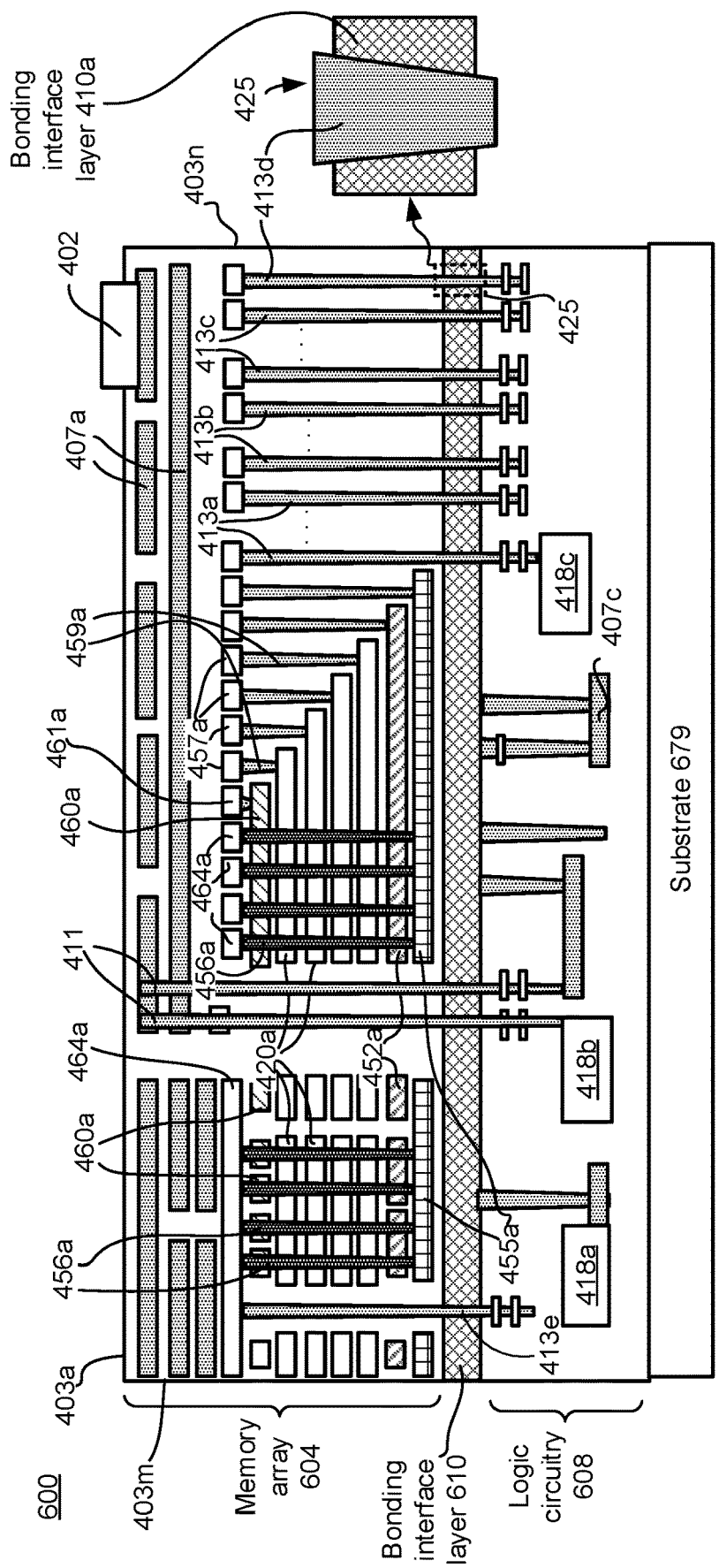

FIGS. 7A, 7B, and 7C collectively illustrate a method for forming a memory structure (such as the memory structure 600 of FIG. 6) comprising a memory array (e.g., memory array 604) and logic circuitry (e.g., logic circuitry 608 of FIG. 6), wherein a bonding interface layer (e.g., bonding interface layer 610) is between the memory array and the logic circuitry, in accordance with some embodiments.

Referring to FIG. 7A, illustrated is the logic circuitry 608 on a substrate 679. A layer 501b, similar to the layers 211 of FIG. 2A, is deposited on the logic circuitry 608. Also illustrated is the array 604, which may be similar to the array 404a of FIG. 5D. The logic circuitry 408 and the array 604 are not yet bonded in FIG. 7A.

Referring now to FIG. 7B, the array 604 is bonded with the logic circuitry 608 using fusion bonding, as discussed with respect to FIG. 5E. Accordingly, the bonding interface layer 610 is formed due to the bonding of the layers 501a, 501b.

Referring now to FIG. 7C, interconnect structures 411, 413 are formed in the array 604, e.g., using deep via etch, as discussed with respect to FIG. 5E. Furthermore, various metallization levels, various terminals (e.g., such as WL connection terminals 457a, SDG connection terminals 461a, etc.), etc. are formed near a top of the array 604, e.g., which extends a height of the array 604. For example, the array 604 in FIG. 7C has a height H4 that is greater than the height H3 of the array 604 in FIG. 7B, e.g., as discussed with respect to FIG. 5E. The resultant structure of FIG. 7C is the structure 600 of FIG. 6.

Figure 8:
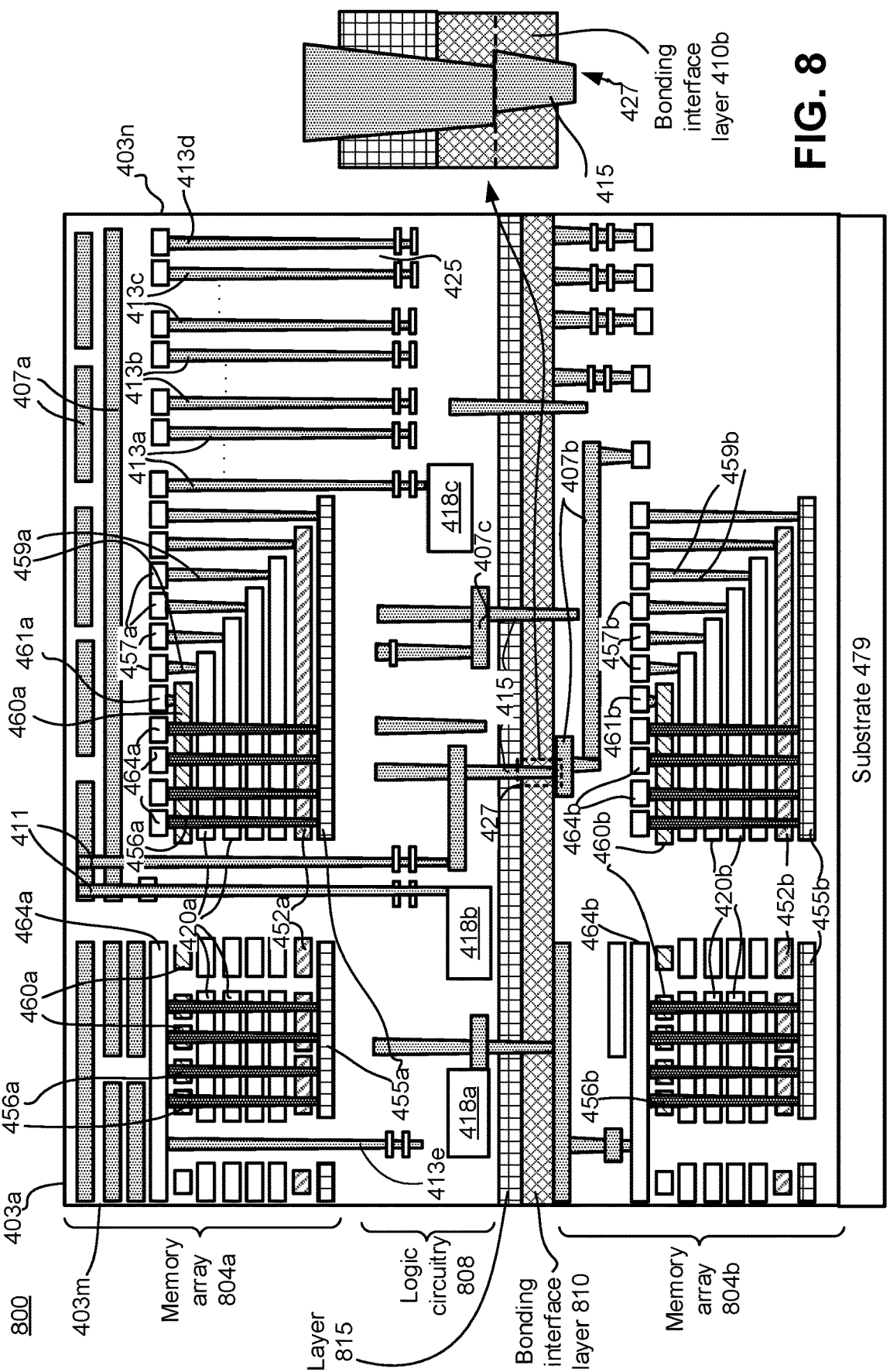
FIG. 8 illustrates a cross-sectional view of a memory structure comprising a first memory array, a second memory array, and logic circuitry, wherein a bonding interface layer is interposed between the second memory array and the logic circuitry, without any such bonding interface layer between the first memory array and the logic circuitry, in accordance with some embodiments.

FIG. 8 illustrates a cross-sectional view of a memory structure 800 (also referred to as a structure 800) comprising a first memory array 804a, a second memory array 804b, and logic circuitry 808, wherein a bonding interface layer 810 is interposed between the second memory array 804b and the logic circuitry 608, without any such bonding interface layer between the first memory array 804a and the logic circuitry 808, in accordance with some embodiments.

In an example, the memory arrays 804a, 804b of FIG. 8 are at least in part similar to the memory arrays 404a, 404b, respectively, of FIG. 4, and accordingly, similar components within the memory arrays in the two figures are labelled using similar labels, and also individual components within the memory arrays 804a, 804b of FIG. 8 are not discussed in detail. In an example, the logic circuitry 808 of FIG. 8 is at least in part similar to the logic circuitry 408 of FIG. 4, and accordingly, similar components in the two logic circuitries are labelled using similar labels, and also individual components within the logic circuitry 808 of FIG. 8 are not discussed in detail.

In an example embodiment, the logic circuitry 808 of FIG. 8 is at least in part formed along with the formation of the memory array 804a. That is, the logic circuitry 808 is bot bonded with the memory array 804a—rather, the logic circuitry 808 is formed in situ with the memory array 804a, as will be discussed herein in further detail in turn. Thus, the array 804a and the logic circuitry 808 are in a single die, whereas the array 804b is in a different die.

In an example embodiment, the combination of the memory array 804a and the logic circuitry 808 is bonded to the memory array 804b, via the bonding interface layer 810. The bonding interface layer 810 is at least in part similar to the bonding interface layers 410 of FIG. 4.

As will be discussed herein in further detail in turn, a layer 815 is between the bonding interface layer 810 and the logic circuitry 808. In an example, the bonding interface layer 810 substantially extends from the sidewall 403n to the sidewall 403m, and the layer 815 also substantially extends from the sidewall 403n to the sidewall 403m. For example, the layer 815 substantially covers (e.g., covers more than 90%, or more than 95%, or more than 99%) a bottom surface of the logic circuitry 808, and the bonding interface layer 810 substantially covers a bottom surface of the layer 815. In an example, the layer 815 comprises silicon, e.g., crystalline silicon. In an example, the layer 815 is remnant of a wafer or substrate on which the combination of the array 804a and the logic circuitry 808 are formed, as will be discussed in further detail in turn.

FIGS. 9A, 9B, 9C, and 9D collectively illustrate a method for forming a memory structure (such as the memory structure 800 of FIG. 8) comprising a first memory array (e.g., array 804a), a second memory array (e.g., array 804b), and logic circuitry (e.g., logic circuitry 808), wherein a bonding interface layer (e.g., bonding interface layer 810) is interposed between the second memory array and the logic circuitry, without any such bonding interface layer between the first memory array and the logic circuitry, in accordance with some embodiments.

Figure 9A:
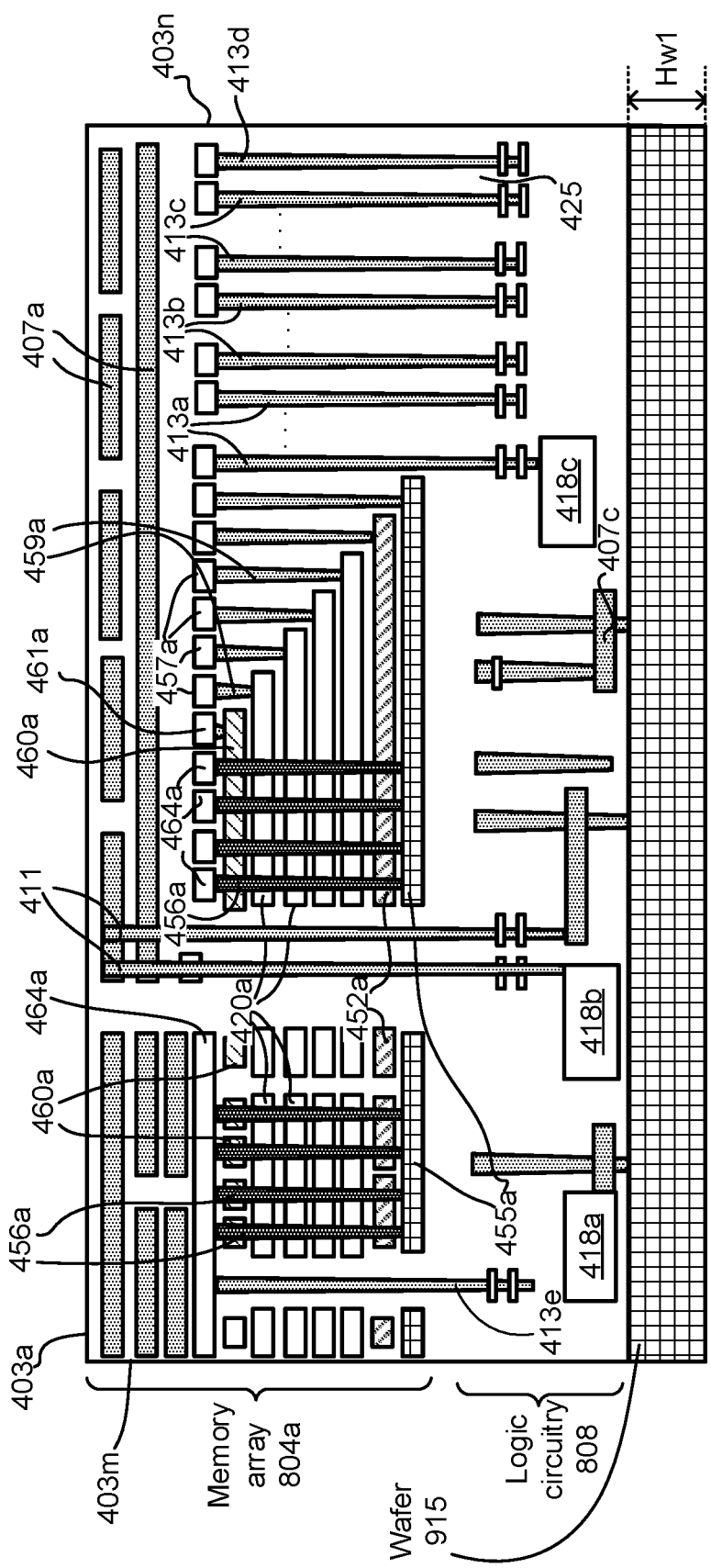

Referring to FIG. 9A, illustrated is a combination of the array 804a and the logic circuitry 808 formed on a wafer 915, such as a silicon wafer.

Figure 9B:
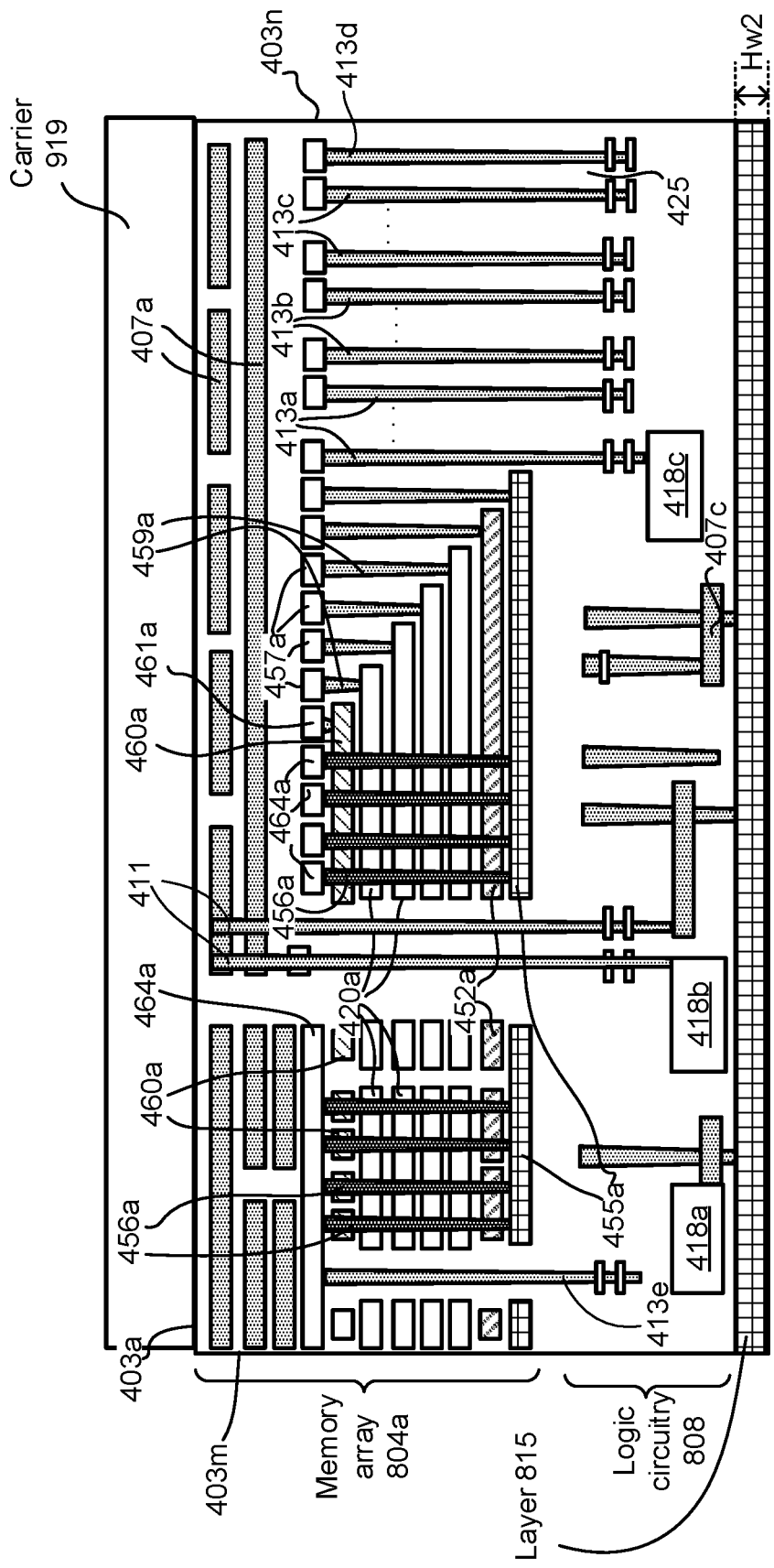

Referring now to FIG. 9B, a temporary carrier wafer 919 is attached to a top surface of the combination of the array 804a and the logic circuitry 808 (e.g., where an opposite bottom surface of the combination of the array 804a and the logic circuitry 808 has the wafer 915 attached thereon). Subsequently, the wafer 915 is polished or otherwise thinned, to decrease a height of the wafer 915, thereby forming the layer 815. For example, in FIG. 9A, the original height of the wafer 915 is Hw1, and the wafer 915 is thinned such that a height of the layer 815 in FIG. 9B is Hw2, where Hw2 is less than Hw1. In an example, the height Hw2 of the layer 815 is in the range of 7 microns to 10 microns.

Referring now to FIG. 9C, layer 901a is deposited on a bottom surface of the layer 815. Also, illustrated in FIG. 9C is the array 804b, with layer 901b deposited on a top surface of the array 804b. The layers 901a, 901b are similar to the layers 501 of FIG. 5A.

After deposition of the layer 901a (and before the bonding process), vias are formed through the layers 901a, 815, and filled with conductive material such as metal, to form interconnection structures 915a through the layers 901a, 815. The combination of the array 804a and the logic circuitry 808 is accessed from the bottom surface (e.g., from the exposed surface of the layer 901a) while forming the vias for the interconnection structures 915a.

Similarly, after deposition of the layer 901b, vias are formed through the layer 901b, and filled with conductive material such as metal, to form interconnection structures 915b through the layer 901b. The array 804b is accessed from the top surface (e.g., from the exposed surface of the layer 901a) while forming the vias for the interconnection structures 915b.

Thus, each of the layers 901a and 901b have openings through which tips of the corresponding interconnect structures 915a, 915b are exposed (e.g., similar to that discussed with respect to FIGS. 3A-3B). For example, the conductive material of the tips of the interconnect structures 915a exposed through the layer 901a and the bottom surface of the layer 901a are flush or co-planar. For example, the bottom surface of the layer 901a is polished, to that tips of the interconnect structures 915a exposed through the layer 901a and the bottom surface of the layer 901a are flush or coplanar. Similarly, the conductive material of the tips of the interconnect structures 915b exposed through the layer 901a and the bottom surface of the layer 901a are flush or at the same level, i.e., coplanar.

Referring now to FIG. 9D, the layers 901a and 901b are bonded to form the bonding interface layer 810. During the bonding process, two corresponding interconnect structures 915a, 915b are also bonded or otherwise come in contact, to form a common interconnect structure 415. Thus, the bonding is between the layers 901a, 901b, as well as between corresponding ones of the interconnect structures 915a, 915b—accordingly, as discussed with respect to FIGS. 3A-3B, the bonding of FIG. 9D is a hybrid bonding. As also discussed with respect to FIGS. 3A-3B, there is a misalignment or offset in two sections of the interconnect structure 415 in FIG. 9D, which is illustrated in a magnified view of a section 427. Although FIG. 9D illustrates multiple via-to-via bonding through the layer 810 (e.g., as discussed with respect to FIGS. 3A-3B), there may be via-to-line bonding as well through the layer 810 (e.g., as discussed with respect to FIG. 3C). The resultant structure of FIG. 9D is the structure 800 of FIG. 8.

Figure 10:
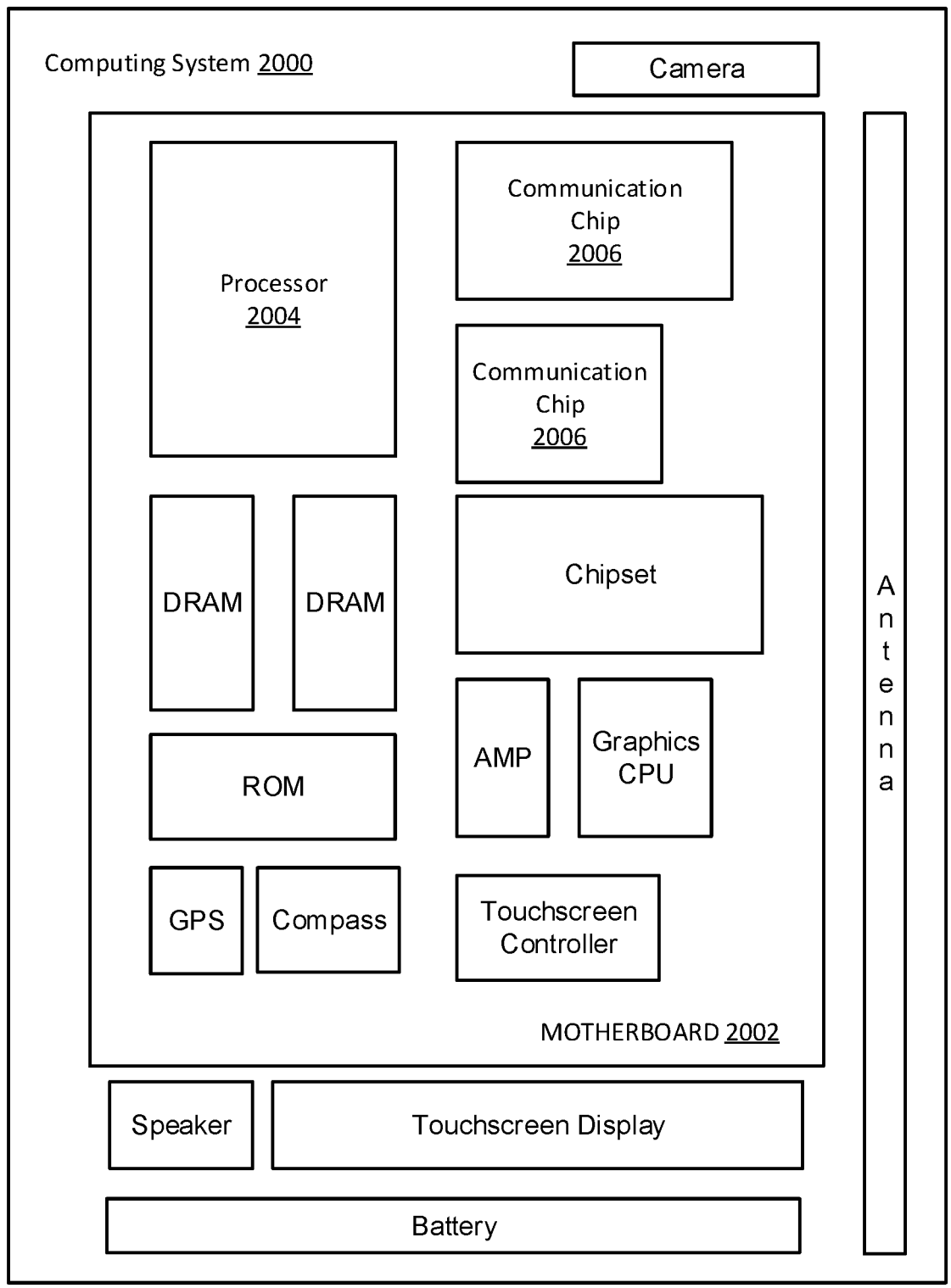
FIG. 10 illustrates an example computing system implemented with one or more integrated memory structures disclosed herein, in accordance with one or more embodiments of the present disclosure.

FIG. 10 illustrates an example computing system implemented with integrated memory structures disclosed herein, in accordance with one or more embodiments of the present disclosure. As can be seen, the computing system 2000 houses a motherboard 2002. The motherboard 2002 may include a number of components, including, but not limited to, a processor 2004 and at least one communication chip 2006, each of which can be physically and electrically coupled to the motherboard 2002, or otherwise integrated therein. As will be appreciated, the motherboard 2002 may be, for example, any printed circuit board, whether a main board, a daughterboard mounted on a main board, or the only board of system 2000, etc.

Depending on its applications, computing system 2000 may include one or more other components that may or may not be physically and electrically coupled to the motherboard 2002. These other components may include, but are not limited to, volatile memory (e.g., DRAM), non-volatile memory (e.g., ROM, flash memory such as 3D NAND flash memory), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In some embodiments, multiple functions can be integrated into one or more chips (e.g., for instance, note that the communication chip 2006 can be part of or otherwise integrated into the processor 2004).

Any memory, such as any flash memory (e.g., a 3D NAND flash memory), included in computing system 2000 may include one or more memory arrays bonded with logic circuitry, as discussed herein. In an example, the logic circuitry is interposed between, and shared among, two memory arrays, as discussed herein.

The communication chip 2006 enables wireless communications for the transfer of data to and from the computing system 2000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 2000 may include a plurality of communication chips 2006. For instance, a first communication chip 2006 may be dedicated to shorter range wireless communications such as Wi-Fi and Bluetooth and a second communication chip 2006 may be dedicated to longer range wireless communications such as GPS, EDGE, GPRS, CDMA, WiMAX, LTE, Ev-DO, and others.

The processor 2004 of the computing system 2000 includes an integrated circuit die packaged within the processor 2004. The term "processor" may refer to any device or portion of a device that processes, for instance, electronic data from registers and/or memory to transform that electronic data into other electronic data that may be stored in registers and/or memory.

The communication chip 2006 also may include an integrated circuit die packaged within the communication chip 2006. As will be appreciated in light of this disclosure, note that multi-standard wireless capability may be integrated directly into the processor 2004 (e.g., where functionality of any chips 2006 is integrated into processor 2004, rather than having separate communication chips). Further note that processor 2004 may be a chip set having such wireless capability. In short, any number of processor 2004 and/or communication chips 2006 can be used. Likewise, any one chip or chip set can have multiple functions integrated therein.

In various implementations, the computing system 2000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices, as variously described herein.

FURTHER EXAMPLE EMBODIMENTS

Numerous variations and configurations will be apparent in light of this disclosure and the following examples.

Example 1. An integrated circuit memory comprising: a memory array comprising a plurality of memory cells; a logic circuitry; and a layer comprising silicon and having a thickness of at least 3000 angstrom, the layer between the memory array and the logic circuitry.

Example 2. The integrated circuit memory of example 1, wherein: the memory array comprises a first sidewall and an opposing second sidewall; and the layer extends from the first sidewall to the second sidewall.

Example 3. The integrated circuit memory of any of examples 1-2, wherein the layer further comprises at least one of oxygen or nitrogen.

Example 4. The integrated circuit memory of any of examples 1-3, wherein the logic circuitry comprises one or more of an address decoder, a buffer, a word line driver, a bit line driver, a sense amplifier, a voltage divider, a charge pump, and/or a digital logic block.

Example 5. The integrated circuit memory of any of examples 1-4, wherein the logic circuitry comprises: a first one or more transistors that operate at a first voltage in the range of 5 volts (V) to 30 V; and a second one or more transistors that operate at a second voltage in the range of 0.9 V to 5 V.

Example 6. The integrated circuit memory of any of examples 1-5, wherein the logic circuitry comprises complementary metal-oxide-semiconductor (CMOS) logic.

Example 7. The integrated circuit memory of any of examples 1-6, wherein the memory array is included in a first die that is bonded to a second die comprising the logic circuitry.

Example 8. The integrated circuit memory of example 7, wherein the layer is a bonding interface layer between the first die and the second die.

Example 9. The integrated circuit memory of any of examples 1-8, wherein the memory array is a first memory array, the layer is a first layer, the integrated circuit memory further comprising: a second memory array, wherein the logic circuitry is between the first and second memory arrays; and a second layer comprising silicon and having a thickness of at least 3000 angstrom, the second layer between the second memory array and the logic circuitry.

Example 10. The integrated circuit memory of example 9, wherein: the first memory array is included in a first die that is bonded to a second die comprising the logic circuitry; the second memory array is included in a third die that is bonded to the second die; the first layer is a first bonding interface layer between the first die and the second die; the second layer is a second bonding interface layer between the third die and the second die; and one or more logic components of the logic circuitry is shared by the first and second memory arrays.

Example 11. The integrated circuit memory of any of examples 1-10, wherein the memory array is a first memory array, the integrated circuit memory further comprising a second memory array, wherein: the first memory array and the logic circuitry are included in a first die; the second memory array is included in a second die that is bonded to the first die; the layer is a bonding interface layer between the first die and the second die; and the logic circuitry is between the first and second memory arrays and one or more logic components of the logic circuitry is shared by the first and second memory arrays.

Example 12. The integrated circuit memory of any of examples 1-8, wherein the layer is a first layer, the integrated circuit memory further comprising: a second layer in direct contact with the first layer, the second layer comprising silicon, the second layer compositionally different from the first layer.

Example 13. The integrated circuit memory of example 12, further comprising: an interconnect structure extending through the first layer and the second layer, wherein the interconnect structure has a first portion that extends through the second layer and a first section of the first layer, and a second portion that extends through a second section of the first layer, and wherein the first portion of the interconnect structure is offset with respect to the second portion of the interconnect structure.

Example 14. The integrated circuit memory of any of examples 12-13, wherein: a length and a width of the first layer is substantially similar to a length and width, respectively, of the second layer.

Example 15. The integrated circuit memory of any of examples 12-13, wherein: the memory array comprises a first sidewall and an opposing second sidewall; and each of the first layer and the second layer extends from the first sidewall to the second sidewall.

Example 16. The integrated circuit memory of any of examples 12-13, wherein: the second layer has a thickness in the range of 7 microns to 10 microns.

Example 17. The integrated circuit memory of any of examples 1-16, wherein the memory array is flash memory array.

Example 18. The integrated circuit memory of any of examples 1-17, wherein the memory array is three-dimensional (3D) NAND flash memory array.

Example 19. A motherboard, wherein the integrated circuit memory of any of examples 1-18 is attached to the motherboard.

Example 20. A computing system comprising the integrated circuit memory of any of examples 1-19.

Example 21. An integrated circuit memory comprising: a first die including a first memory array; a second die including a second memory array; a third die including logic circuitry comprising a plurality of logic components, the third die between the first and second dies; a first bonding interface that bonds the first die to the third die; and a second bonding interface that bonds the second die to the third die.

Example 22. The integrated circuit memory of example 21, wherein: at least one of the first and second bonding interfaces comprises silicon and oxygen, and has a thickness of at least 3000 angstrom.

Example 23. The integrated circuit memory of any of examples 21-22, wherein: at least one of the first and second bonding interfaces comprises silicon and nitrogen, and has a thickness of at least 3000 angstrom.

Example 24. The integrated circuit memory of any of examples 21-23, wherein: the first die has a first surface facing a second surface of the third die; and the first bonding interface is on substantially an entirety of the first surface of the first die.

Example 25. The integrated circuit memory of any of examples 21-24, wherein: the first bonding interface is on substantially an entirety of the second surface of the third die.

Example 26. The integrated circuit memory of any of examples 21-25, wherein the plurality of logic components includes one or more of an address decoder, a buffer, a word line driver, a bit line driver, a sense amplifier, a voltage divider, a charge pump, and/or a digital logic block.

Example 27. The integrated circuit memory of any of examples 21-26, wherein the plurality of logic components includes: a first one or more transistors that operate at a first voltage in the range of 5 volts (V) to 30 V; and a second one or more transistors that operate at a second voltage in the range of 0.9 V to 5 V.

Example 28. The integrated circuit memory of any of examples 21-27, wherein the first and second memory arrays are three-dimensional (3D) flash memory arrays and the logic components include complementary metal oxide semiconductor (CMOS) logic components.

Example 29. The integrated circuit memory of any of examples 21-28, wherein the first and second memory arrays are three-dimensional (3D) NAND flash memory arrays.

Example 30. A motherboard, wherein the integrated circuit memory of any of examples 21-29 is attached to the motherboard.

Example 31. A computing system comprising the integrated circuit memory of any of examples 21-30.

Example 32. An integrated circuit memory comprising: a first die including a first memory array and logic circuitry; a second die including a second memory array; and a bonding interface that bonds the first die to the second die, wherein the logic circuitry is between the first and second memory arrays, wherein one or more logic components of the logic circuitry is shared by the first and second memory arrays.

Example 33. The integrated circuit memory of example 32, wherein the first and second memory arrays are three-dimensional (3D) NAND flash memory arrays.

Example 34. A motherboard, wherein the integrated circuit memory of any of examples 32-33 is attached to the motherboard.

Example 35. A computing system comprising the integrated circuit memory of any of examples 32-34.

Example 36. A method to form an integrated flash memory structure, the method comprising: forming a memory array having a first layer on a surface of the memory array; forming a logic circuitry having a second layer on a surface of the logic circuitry; and bonding the memory array and the logic circuitry using the first layer and the second layer.

Example 37. The method of example 36, further comprising: subsequent to bonding the memory array and the logic circuitry, forming a via through a bonding interface that is formed between the memory array and the logic circuitry; and depositing metal material within the via.

Example 38. The method of example 36, further comprising: prior to bonding the memory array and the logic circuitry, forming a first conductive structure that extends through the first layer and a second conductive structure that extends through the second layer, wherein subsequent to bonding the memory array and the logic circuitry, the first conductive structure and the second conductive structure are bonded to form an integrated conductive structure.

Example 39. The method of example 38, wherein within the integrated conductive structure, the first conductive structure is misaligned with respect to the second conductive structure.

Example 40. The method of example 39, wherein the first conductive structure is one of a first via comprising conductive material or a first conductive line, and the second conductive structure is one of a second via comprising conductive material or a second conductive line.

Example 41. The method of any of examples 38-40, wherein: prior to bonding the memory array and the logic circuitry, the first conductive structure is exposed through a first surface of the first layer that is to be bonded with the second layer, and a tip of the first conductive structure is flush with the first surface; and prior to bonding the memory array and the logic circuitry, the second conductive structure is exposed through a second surface of the second layer that is to be bonded with the first layer, and a tip of the second conductive structure is flush with the second surface.

Example 42. The method of any of examples 36-41, wherein the memory array is a first memory array, the method further comprising: forming a second memory array having a third layer on a surface of the second memory array; forming a fourth layer on another surface of the logic circuitry; and bonding the second memory array and the logic circuitry using the third layer and the fourth layer.

Example 43. The method of example 42, wherein the logic circuitry is between the first and second memory arrays.

Example 44. The method of example 36, wherein: the memory array is a first memory array; bonding the first memory array and the logic circuitry comprises bonding the first layer and the second layer to form a bonding interface layer; forming the logic circuitry comprises forming the logic circuitry along with forming a second memory array, such that no bonding interface layer is between the logic circuitry and the second memory array; and bonding the first memory array and the logic circuitry comprises bonding the first memory array with a combination of the logic circuitry and the second memory array.

The foregoing detailed description has been presented for illustration. It is not intended to be exhaustive or to limit the disclosure to the precise form described. Many modifications and variations are possible in light of this disclosure. Therefore it is intended that the scope of this application be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit memory comprising:
a first memory array comprising a first plurality of memory cells;
a logic circuitry;
a first layer comprising silicon, the first layer between the first memory array and the logic circuitry;
a second memory array, wherein the logic circuitry is between the first and second memory arrays; and
a second layer comprising silicon, the second layer between the second memory array and the logic circuitry.

2. The integrated circuit memory of claim 1, wherein each of the first and second layers has a thickness of at least 3000 angstrom.

3. The integrated circuit memory of claim 1, wherein:
the first memory array comprises a first sidewall and an opposing second sidewall; and
the first layer extends from the first sidewall to the second sidewall.

4. The integrated circuit memory of claim 1, wherein the first layer further comprises at least one of oxygen or nitrogen.

5. The integrated circuit memory of claim 1, wherein the logic circuitry comprises one or more of an address decoder, a buffer, a word line driver, a bit line driver, a sense amplifier, a voltage divider, a charge pump, a digital logic block, and/or complementary metal-oxide-semiconductor (CMOS) logic.

6. The integrated circuit memory of claim 1, wherein the logic circuitry comprises:
a first one or more transistors that operate at a first voltage in the range of 5 volts (V) to 30 V; and
a second one or more transistors that operate at a second voltage in the range of 0.9 V to 5 V.

7. The integrated circuit memory of claim 1, wherein:
the first memory array is included in a first die that is bonded to a second die comprising the logic circuitry; and
the first layer is a bonding interface layer between the first die and the second die.

8. The integrated circuit memory of claim 1, wherein:
the first memory array is included in a first die that is bonded to a second die comprising the logic circuitry;
the second memory array is included in a third die that is bonded to the second die;
the first layer is a first bonding interface layer between the first die and the second die;
the second layer is a second bonding interface layer between the third die and the second die; and
one or more logic components of the logic circuitry is shared by the first and second memory arrays.

9. An integrated circuit memory comprising:
a first die that includes (i) a first memory array comprising a first plurality of memory cells and (ii) a logic circuitry;
a second die that is bonded to the first die, wherein the second die includes a second memory array comprising a second plurality of memory cells;
a layer comprising silicon between the first die and the second die,
wherein the logic circuitry is between the first and second memory arrays, and one or more logic components of the logic circuitry is shared by the first and second memory arrays.

10. The integrated circuit memory of claim 1, further comprising:
a third layer in direct contact with the first layer, the third layer comprising silicon, the second layer compositionally different from the first layer.

11. The integrated circuit memory of claim 10, further comprising:
an interconnect structure extending through the first layer and the third layer,
wherein the interconnect structure has a first portion that extends through the third layer and a first section of the first layer, and a second portion that extends through a second section of the first layer, and
wherein the first portion of the interconnect structure is offset with respect to the second portion of the interconnect structure.

12. The integrated circuit memory of claim 1, wherein the memory array is three-dimensional (3D) NAND flash memory array.

13. A motherboard, wherein the integrated circuit memory of claim 1 is attached to the motherboard.

14. The integrated circuit memory of claim 1, further comprising:
a first die that includes the first memory array; and
a second die that includes the logic circuitry,
wherein the first die has a surface facing the second die, and
wherein the first layer is on substantially an entirety of the surface of the first die and/or the first layer is on substantially an entirety of the surface of the second die.

15. The integrated circuit memory of claim 1, further comprising:
an interconnect structure to couple the first memory array and the logic circuitry, the interconnect structure extending through the first layer.

16. An integrated circuit memory comprising:
a memory array comprising a plurality of memory cells, the memory array having a first sidewall and an opposing second sidewall;
a logic circuitry having a third sidewall and an opposing fourth sidewall;
a first layer comprising silicon between the memory array and the logic circuitry, the first layer extending from the first sidewall to the second sidewall of the memory array;
a second layer in direct contact with the first layer, the second layer comprising silicon, the second layer extending from the third sidewall to the fourth sidewall of the logic circuitry;
an interconnect structure extending through the first layer and the second layer,
wherein the interconnect structure has a first portion that extends through the first layer, and a second portion that extends through the second layer, and wherein the first portion of the interconnect structure is offset with respect to the second portion of the interconnect structure at an interface between the first and second layers.

17. The integrated circuit memory of claim 16, wherein each of the first and second layers has a thickness of at least 3000 angstrom.

* * * * *